US010529775B2

(12) United States Patent
Wang et al.

(10) Patent No.: US 10,529,775 B2
(45) Date of Patent: *Jan. 7, 2020

(54) TWO-TERMINAL SPINTRONIC DEVICES

(71) Applicant: Regents of the University of Minnesota, Minneapolis, MN (US)

(72) Inventors: Jian-Ping Wang, Shoreview, MN (US); Yang Lv, New Brighton, MN (US); Mahdi Jamali, Folsom, CA (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/374,925

(22) Filed: Apr. 4, 2019

(65) Prior Publication Data

US 2019/0237510 A1    Aug. 1, 2019

Related U.S. Application Data

(63) Continuation of application No. 15/839,081, filed on Dec. 12, 2017, now Pat. No. 10,283,561.
(Continued)

(51) Int. Cl.
*G11C 11/00* (2006.01)
*H01L 27/22* (2006.01)
(Continued)

(52) U.S. Cl.
CPC .......... *H01L 27/224* (2013.01); *G11C 11/16* (2013.01); *G11C 11/161* (2013.01); *G11C 11/1659* (2013.01); *G11C 11/1673* (2013.01); *G11C 11/1675* (2013.01); *G11C 11/18* (2013.01); *H01L 27/22* (2013.01); *H01L 27/222* (2013.01); *H01L 43/04* (2013.01); *H01L 43/08* (2013.01); *H01L 43/10* (2013.01); *H03K 19/177* (2013.01);
(Continued)

(58) Field of Classification Search
CPC ..... H01L 27/224; H01L 27/22; H01L 27/222; H01L 43/10; H01L 43/08; H01L 43/04; G11C 11/16; G11C 11/1673; G11C 11/1659; G11C 11/18; G11C 11/1675; G11C 11/161; H03K 19/177; H03K 19/1776; H03K 19/18
USPC ........................................................ 365/158
See application file for complete search history.

(56) References Cited

U.S. PATENT DOCUMENTS 9,099,119 B2    8/2015  Mihajlovic et al.
10,283,561 B2   5/2019  Wang et al.
(Continued)

OTHER PUBLICATIONS

Acvi et al., "Interplay of spin-orbit torque and thermoelectric effects in ferromagnet/normal metal bilayers," Dec. 2, 2014, Physical Review B, 26 pp.
(Continued)

*Primary Examiner* — Tha-O H Bui
(74) *Attorney, Agent, or Firm* — Shumaker & Sieffert, P.A.

(57) ABSTRACT

This disclosure describes an example device that includes a first contact line, a second contact line, a spin-orbital coupling channel, and a magnet. The spin-orbital coupling channel is coupled to, and is positioned between, the first contact line and second contact line. The magnet is coupled to the spin-orbital coupling channel and positioned between the first contact line and the second contact line. A resistance of the magnet and spin-orbital coupling channel is a unidirectional magnetoresistance.

18 Claims, 22 Drawing Sheets

Related U.S. Application Data

(60) Provisional application No. 62/434,166, filed on Dec. 14, 2016.

(51) Int. Cl.

| | | |
|---|---|---|
| G11C 11/16 | (2006.01) | |
| H03K 19/18 | (2006.01) | |
| H01L 43/04 | (2006.01) | |
| G11C 11/18 | (2006.01) | |
| H03K 19/177 | (2006.01) | |
| H01L 43/08 | (2006.01) | |
| H01L 43/10 | (2006.01) | |

(52) U.S. Cl.
CPC ......... *H03K 19/1776* (2013.01); *H03K 19/18* (2013.01)

(56) References Cited

U.S. PATENT DOCUMENTS

| | | | |
|---|---|---|---|
| 2006/0098478 A1 | 5/2006 | Ezaki et al. | |
| 2009/0034131 A1 | 2/2009 | Yamada et al. | |
| 2010/0097063 A1* | 4/2010 | Ando | B82Y 10/00 324/316 |
| 2015/0213865 A1* | 7/2015 | Wu | G11C 11/161 365/158 |

OTHER PUBLICATIONS

Ando et al., "Electric Manipulation of spin relaxation in a film using spin-Hall effect," Physical Review Letters, published online Jul. 18, 2008, 4 pp.
Aradhya et al., "Nanosecond-Timescale Low Energy Switching of In-Plane Magnetic Tunnel Junctions through Dynamic Oersted-Filed-Assisted Spin Hall Effect," NANO letters, Jun. 21, 2016, 6 pp.
Avci et al., "Unidirectional spin Hall Magnetoresistance in ferromagnet/ normal metal bilayers," Nature Physics, Jun. 8, 2015, 7 pp.
Baker et al., "Spin pumping in Ferromagnet-Topological Insulatior-Ferromagnet Heterostructures," Scientific Reports, Jan. 20, 2015, 5 pp.
Deorani et al., "Observation of inverse spin Hall effect in bismuth selenide," Physical Review B, American Physical Society, Sep. 3, 2014, 18 pp.
Fan et al., Electric-field control of spin-orbit torque in a magnetically doped topological insulator, Nature Nanotechnology, Jan. 4, 2016, 41 pp.
Fan et al., "Magnetization switching through giant spin—orbit torque in a magnetically doped topological insulator heterostructure," Nature Materials, Apr. 28, 2014, 6 pp.
Kim et al., "Spin Hall Magnetoresistance in Metallic Bilayers," Physical Review Letters, American Physical Society, Feb. 29, 2016, 5 pp.
Li et al., "Electrical detection of charge-current-induced spin polarization due to spin-momentum locking in Bi2Se3," Nature Nanotechnology, vol. 9, Feb. 23, 2014, 7 pp.
Liu et al., "Spin torque switching with the giant spin Hall effect of tantalum," Science, vol. 336, Issue 6081, May 4, 2012, 31 pp.
Lv et al., "Unidirectional spin Hall Magnetoresistance in Ta/Fe and Pt/Fe bilyaers," Poster Presentation MMM 2016, Nov. 2, 2016, 1 pp.
Mellnik et al., "Spin Transfer Torque Generated by the Toplogical Insulator Bi2Se3," Nano Letters, Sep. 2015, 34 pp.
Olejnik et al., "Electrical detection of magnetization reversal without auxiliary magnets," Physical Review B, Rapid Communications, May 11, 2015, 5 pp.
Qi et al., "Topological insulators and superconductors," Reviews of Modem Physics, Aug. 12, 2010, 54 pp.
Rojas-Sanchez et al., "Spin to Charge Conversion at Room Temperature by Spin Pumping into a New Type of Toplological Insulator a-SN Films," Physical Review Letters, American Physical Society, Mar. 4, 2016, 6 pp.
Shiomi et al., "Spin-Electricity Conversion Induced by Spin Injection into Topological Insulators," Physical Review Letters, American Physical Society, Nov. 7, 2014, 5 pp.
Tang et al., "Electrical Detection of Spin-Polarized Surface States Conduction in (Bi0.53Sb0.47)2Te3 Toplogical Insulator," NANO Letters, American Chemical Society, Aug. 26, 2014, 7 pp.
Wang et al., "Surface state dominated spin-charge current conversion in topological insulator/ferromagnetic insulator heterostructures," PRL 117, 076601, Jul. 13, 2016, 13 pp.
Hsieh et al., "A tunable toplogical insulator in the spin helical Dirac transport regime," Nature Letters vol. 460, ResearchGate, Aug. 2009, 16 pp.
Tian et al., "Electrical injection and detection of spin-polarized currents in topological insulator Bi2Te2S," Scientific Reports, Sep. 22, 2015, 8 pp.
Yasuda et al., "Large Unidirectional Magnetoresistance in a Magnetic Toplogical Insulator," Physical Review Letters, Sep. 14, 2016, 5 pp.
Avci et al., "Magnetoresistance of heavy and light metal/ ferromagnet bilayers," Appl. Phys. Lett. 107, 192405, Mesoscale and Nanoscale Physics, Oct. 22, 2015, 14 pp.
Jamali et al., "Giant Spin Pumping and Inverse Spin Hall Effect in the Presense of Surface and Bulk Spin-Orbit Coupling of Topological Insulator Bi2Se3," NANO letters, American Chemical Society, Sep. 14, 2015, 7 pp.
Avci et al., "Unidirectional spin Hall Magnetoresistance in ferromagnet/ normal metal bilayers," submitted to Nature Physics, Jun. 12, 2015, 31 pp.
Kim et al., "Layer thickness dependence of the current induced effective field vector in Ta|CoFeB|MgO," Nature Materials, Dec. 23, 2012, 24 pp.
Lachman et al., "Visualization of superparamagnetic dynamics in magnetic topological insulators," Materials Science, Nov. 6, 2015, 7 pp.
Lee et al., "Mapping the chemical potential dependence of current-induced spin polarization in a topological insulator," Physical Review B, Jul. 25, 2015, 17 pp.
Miron et al., "Perpendicular Switching of a Single Ferromagnetic Layer Induced by In-Plane Current Injection," ResearchGate, vol. 476, Aug. 2011, 7 pp.
Nakayama et al., "Spin Hall Magnetoresistance Induced by a Non-Equilibrium Proximity Effect," Physical Review Letters, May 13, 2013, 20 pp.
Neupane et al., "Observation of quantum-tunnelling-modulated spin texture in ultrathin topological insulator Bi2Se3 films," Nature Communications, Macmillan Publishers Limited, May 12, 2014, 7 pp.
Pai et al., "Spin Transfer torque devices utilizing the giant spin Hall effect of tungsten," Applied Physical Letters, Sep. 2012, 18 pp.
Lang et al., "Proximity Induced High-Temperature magnetic Order in Topological Insulator—Ferrimagnetic Insulator Heterostructure," NANO Letters, American Chemical Society Publications, May 19, 2014, 7 pp.
Prosecution History from U.S. Appl. No. 15/839,081, dated Dec. 17, 2018 through Mar. 27, 2019, 20 pp.

* cited by examiner

Memory Cell Layouts
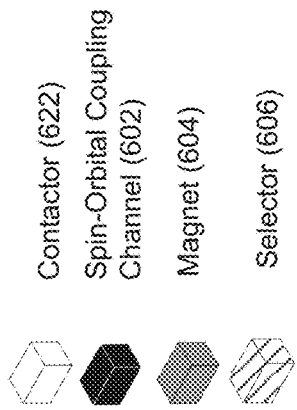
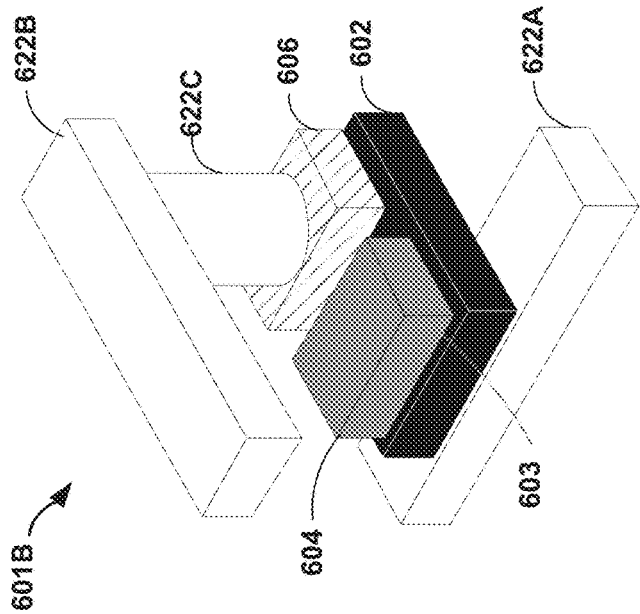
FIG. 6B Lateral Cell selector on cell
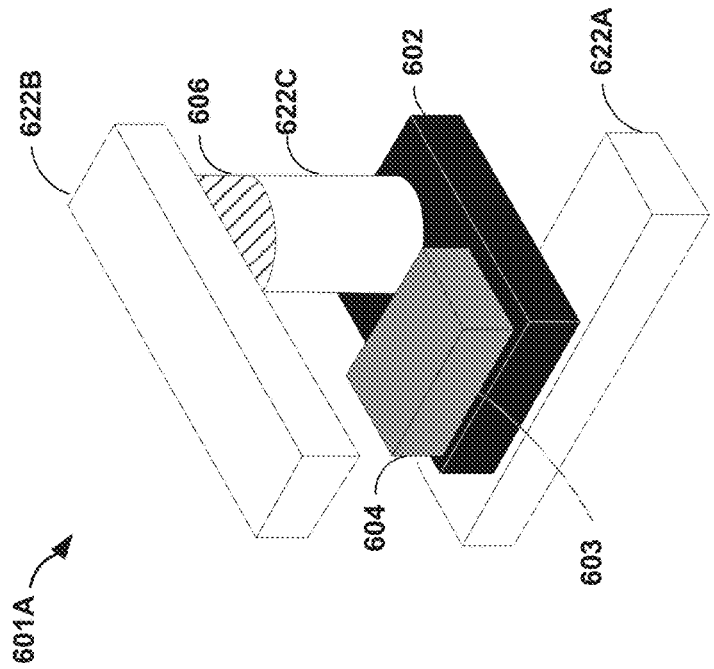
FIG. 6A Lateral Cell selector in via

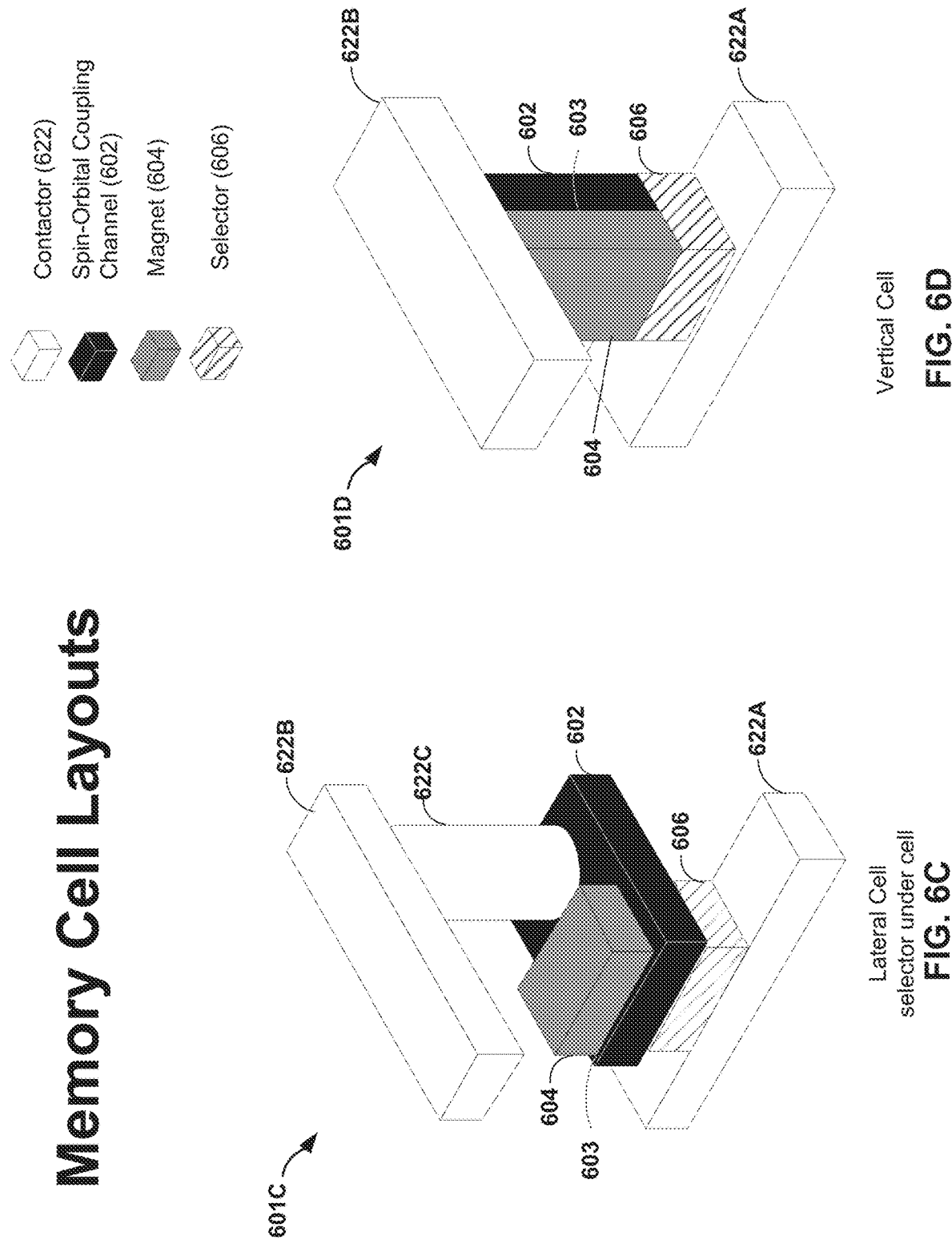

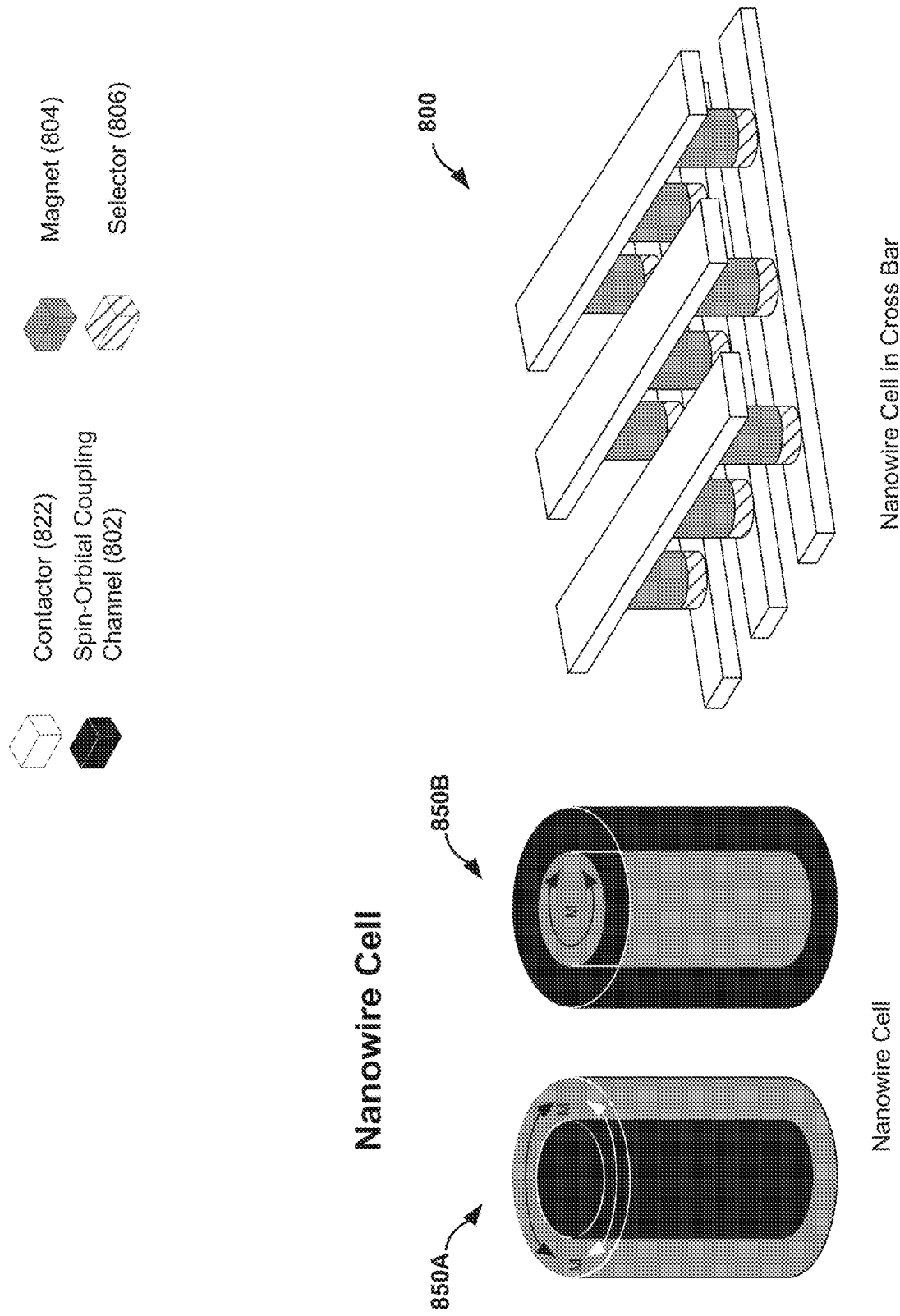

Magnetic nanoparticle proximity sensing

- Magnetic Nano-particles (904)
- Spin-Orbital Coupling Channel (902)
- Contactor (922)

TWO-TERMINAL SPINTRONIC DEVICES

This application is a continuation of U.S. application Ser. No. 15/839,081, filed Dec. 12, 2017, which claims the benefit of U.S. Provisional Application No. 62/434,166, filed Dec. 14, 2016, the entire contents of which are incorporated by reference herein.

GOVERNMENT INTEREST

This invention was made with government support under Grant No. HR0011-13-3-0002 awarded by Department of Defense/Defense Advanced Research Projects Agency (DARPA). The government has certain rights in the invention.

TECHNICAL FIELD

This disclosure relates to articles including magnetic structures, and more particularly, magnetic structures for memory and logic devices.

BACKGROUND

The scaling of conventional semiconductor devices may be limited by factors including device reliability and increased power consumption. Improvement in the performance of memory and computational devices is continuously pursued. Spin-based or spintronic devices may be used as alternatives to or in conjunction with electronic devices. Spin-based effects may be used by devices such as spintronic devices that harness the intrinsic spin of electrons and their associated magnetic moments, in addition to electronic phenomena that arise from the fundamental electronic charges of electrons. Magnetic structures may be used in spintronic devices including memory and computational devices. For example, memory devices such as magnetic random access memory (MRAM) or spin-transfer torque random access memory (STT-RAM) may be based on the relative magnetic orientation of multiple magnetic layers.

SUMMARY

In general, the disclosure describes examples of two-terminal spintronic devices such as memory or logic devices. The two-terminal spintronic devices may be based on a unidirectional resistance of a nonmagnetic material (e.g., a spin-orbital coupling channel) and a ferromagnetic material (e.g., a magnet), which may be referred to as unidirectional spin Hall magnetoresistance (USMR) effects. For USMR effect, current of a threshold amplitude through a non-magnetic (NM) material that has strong spin-orbit interaction (SOI) causes a magnetization direction of a ferromagnetic (FM) layer to switch. The magnetization direction of the FM layer may be correlated with the resistance at the interface between the FM material and the NM material. In some examples, the resistance of the FM material and the NM material may be constant. In other words, the resistance of the FM material alone and the resistance of the NM material alone may not change, but the total resistance of the combination of the FM material and the NM material may be a unidirectional magnetoresistance that changes depending on the magnetization direction of the FM layer (e.g., the resistance at the interface between the FM material and the NM material may change, which may cause a change in the total resistance). By applying a current greater than the threshold current density (e.g., amplitude, but not limited to amplitude) through the NM material, a controller circuit may set the resistance of the combined NM material and FM material (e.g., the current may change the resistance at the interface). Then, by applying a current less than the threshold current density through the NM material, the controller circuit may read a voltage across the combination of the NM material, the FM material, and the interface between the NM material and the FM material, such that the controller circuit may determine the resistance of the combination of the NM material, the FM material, and the interface. In this way, the resistance of the device may be used as way to convey a digital high or a digital low.

In some examples, the disclosure describes a device that includes a first contact line, a second contact line, a spin-orbital coupling channel, and a magnet. The spin-orbital coupling channel is coupled to, and is positioned between, the first contact line and second contact line. The magnet is coupled to the spin-orbital coupling channel and positioned between the first contact line and the second contact line. A resistance of the magnet and spin-orbital coupling channel is a unidirectional magnetoresistance. The magnet is directly coupled to the spin-orbital coupling channel and at least one of the first contact line or the second contact line. The spin-orbital coupling channel is directly coupled to the at least one of the first contact line or the second contact line.

In another example, the disclosure describes a device that includes a first contact line, a second contact line, a third contact line, a first spin-orbital coupling channel, a second spin-orbital coupling channel, a first magnet, and a second magnet. The first spin-orbital coupling channel is positioned between the first contact line and second contact line and directly coupled to at least one of the first contact line or the second contact line. The second spin-orbital coupling channel is positioned between the second contact line and the third contact line and directly coupled to at least one of the second contact line or the third contact line. The first magnet is positioned between the first contact line and the second contact line and directly coupled to the first spin-orbital coupling channel. The second magnet is positioned between the second contact line and the third contact line and directly coupled to the second spin-orbital coupling channel. A resistance of the first magnet and the first spin-orbital coupling channel is a unidirectional magnetoresistance and a resistance of the second magnet and second spin-orbital coupling channel is a unidirectional magnetoresistance.

In yet another example, the disclosure describes a device that includes a first contact line, a second contact line, a spin-orbital coupling channel, a magnet, and a controller circuit. The spin-orbital coupling channel is configured to receive a read current and a write current. The spin-orbital coupling channel is coupled to, and is positioned between, the first contact line and second contact line. The magnet is coupled to the spin-orbital coupling channel and positioned between the first contact line and the second contact line. A resistance of the magnet and spin-orbital coupling channel is a unidirectional magnetoresistance. The controller circuit is configured to: output a write current through the spin-orbital coupling channel to set a resistance of the magnet to a first resistance level indicative of a first digital value or a second resistance level indicative of a second digital value; and output the read current through the spin-orbital coupling channel to determine whether the resistance is at the first resistance level or the second resistance level, without outputting a current through the magnet.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 6A-6D are conceptual diagrams illustrating examples of memory cell layouts.

FIG. 8A is a conceptual diagram illustrating an example of nanowire cell.

FIG. 8B is a conceptual diagram illustrating an example of a nanowire cell in cross bar.

DETAILED DESCRIPTION

Figure 1:
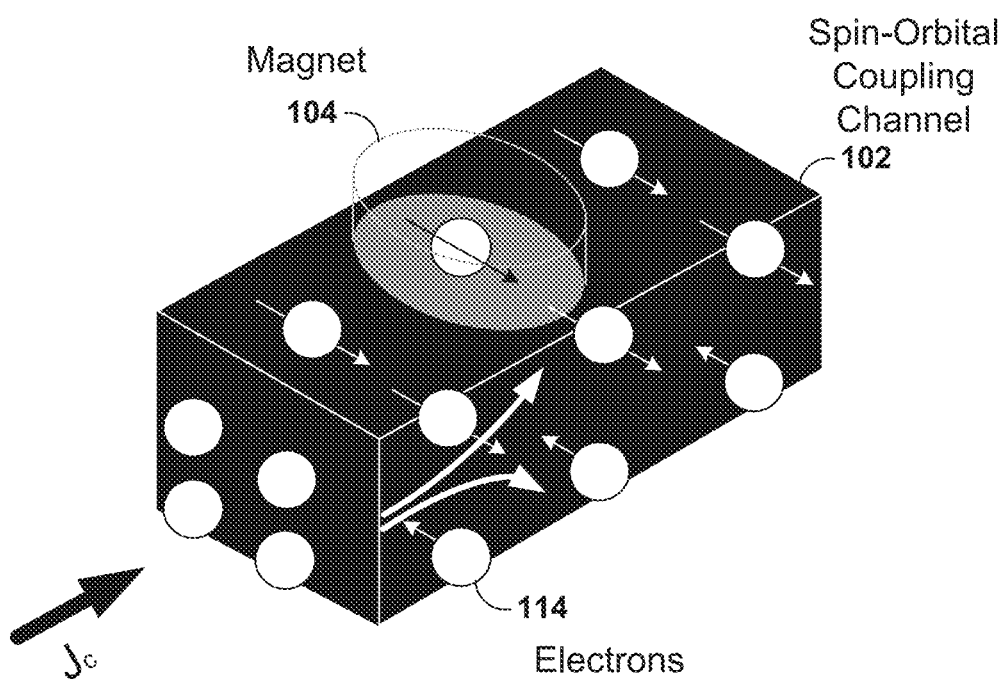
FIG. 1 is a conceptual diagram illustrating an example of spin Hall effect.

This disclosure describes a two-terminal spintronic device, which may overcome limitations of three-terminal spintronic devices for memory and computation applications. The example techniques may be applicable to support a magnetic cross-bar memory architecture, a magnetic 3D memory architecture, and computation in magnetic memory architecture.

Current semiconductor devices face many challenges and bottlenecks including the difficulty to further scale, increased dynamic and static power consumption, and limitations of speed. Instead of using the charge of electrons to represent, store, transfer and compute information, the spin momentum of electrons can also be used. The technology of utilizing electron spins is called Spintronics.

Spintronics may feature better scalability, better speed, less power consumption, and non-volatility. Example uses of spintronics such as in spin transfer torque random access memory (STT-RAM) have already emerged. However, devices like STT-RAM may still exhibit issues such as lower switching efficiency, which in turn leads to worse power consumption and worse reliability. The spin Hall effect in some heavy metals and the topological insulators may be alternatives to achieve magnetization switching more efficiently than STT.

The spin Hall effect (SHE) is a phenomenon of electron spins to deflect transversely when a charge current is applied in a non-magnetic (NM) material that has strong spin-orbit interaction (SOI). This may lead to polarized spins flow, which is called spin current, and spin accumulation at interfaces. If a ferromagnetic (FM) layer is in contact with the NM layer, the spins generated by the SHE will interact with the magnetization of the FM due to the transfer of angular momentum from the spin to the magnetization. In some cases, with the transfer of the angular momentum, the magnetization in FM can be switched by utilizing the SHE.

Topological insulators (TIs) are a kind of material whose bulk is electrically insulating but whose surfaces may be conductive. The electrons flowing on the surface of a TI may be spin polarized (e.g., completely spin polarized) due to the spin-momentum locking of the surface states. These electron spins may exert large torques on magnetization nearby. Although TIs possess different physics compared to heavy metals, TIs may generate spins and switch magnetizations in a similar way in terms of the device structure, directions of current and torque. Accordingly, both heavy metals and TIs may be considered as functioning in a SHE or SHE-like fashion when used to switch a magnet.

However, while such devices can be made more efficient to switch using the SHE or TIs, the device may require a third terminal and a magnetic tunneling junction (MTJ) structure in order to read out the magnetization state. This makes such devices more difficult to fabricate and weakens their scalability. Stated another way, SHE or TIs may be used to set the magnetization state of a magnet to a first magnetization state or a second magnetization state. The first magnetization state corresponds to a first digital value (e.g., logic high or low), and the second magnetization state corresponds to a second digital value (e.g., other of the logic high or low). As described above, the magnetization state is set by driving a current through the NM material. In this case, the input of the NM material and the output of the NM material form first and second terminals, respectively. In this way, SHE or TIs are used to store a digital value on the magnet.

However, reading the digital value, by determining the magnetization state of the magnet, may require another terminal and an MTJ structure that includes a free FM layer and a fixed FM layer. Conventionally, the resistance of a single magnetic layer in a first magnetization state is the same as the resistance of the single magnetic layer in a second magnetization state. Thus, in order to store and subsequently read the digital value, a conventional memory or logic device that utilizes the SHE includes a MTJ structure with a free FM layer and a fixed FM layer because the resistance of the MTJ as a whole changes depending on whether the free FM layer is parallel or anti-parallel to the fixed FM layer. Thus, when the device includes an MTJ, a current is output through the MTJ (which forms the third terminal) to determine the resistance of the MTJ and hence the digital value stored by the memory device.

This disclosure describes examples where a two-terminal spintronic device may be used, rather than the three-terminal example described above. The use of such two-terminal devices reduces needed components, which allows for the spintronic devices to be scaled down even further. Such reduction in size and reduction in terminals may be beneficial for examples of memories and logic devices.

For example, devices that exhibit a unidirectional resistance of a spin-orbital coupling channel (e.g., a spin hall channel) and a magnet, which may be referred to as unidirectional spin Hall magnetoresistance (USMR), may provide for devices with two terminals that do not require an MTJ for reading the magnetization state of the magnet. In some examples, the unidirectional magnetoresistance of the spin-orbital coupling channel may change from a first resistance value to a second resistance value depending on the magnetization direction of the magnet (e.g., the magnetization direction of the magnet may affect the resistance of an interface between the magnet and the spin-orbital coupling channel).

According to techniques of this disclosure, unidirectional resistance means the resistance of the spin-orbital channel and the magnet is a first resistance level when the magnetization direction of the magnet is a first direction, and the resistance is a second resistance level when the magnetization direction is a second direction. For instance, the unidirectional magnetoresistance may be a first value when the magnetization direction of the magnet is at approximately 0 degrees (e.g., relative to a reference direction, which may be defined by the direction of the electron spin of the spin-orbital coupling channel) and a second value when the magnetization direction of the magnet is approximately 180 degrees. In some examples, the resistance values may be different at magnetization directions other than 0 degrees and 180 degrees depending on the structure of the magnet. For example, the first magnetization direction may be approximately 45 degrees (e.g., ±44.99 degrees) and the second magnetization direction may be approximately 135 degrees (e.g., ±44.99 degrees). As another example, the first magnetization direction may be approximately 0° (e.g., ±up to 89.99°) and the second magnetization direction may be approximately 180° (e.g., ±up to 89.99°). In other examples, the first magnetization direction may be approximately 0° (e.g., ±45°) and the second magnetization direction may be approximately 180° (e.g., ±45°). As yet another example, the first magnetization direction may be approximately 30° (e.g., ±59.99°) and the second magnetization direction may be approximately 150° (e.g., ±59.99°). In some examples, the magnetization directions may be defined in the 180° to 360° range.

In some examples, the resistance may be different for more than two magnetization states. In other words, the resistance may be a first value when the magnetization direction is approximately 0 degrees, a second value when the magnetization direction is approximately 90 degrees, and a third value when the magnetization direction is approximately 180 degrees.

In a simple FM/NM structure, due to the spins accumulation from SHE at the interface, the USMR is present. The unique angular dependency of USMR, which is also left-right sensitive like the tunneling magnetoresistance, makes it a substitute for three terminal devices. Thus, with USMR, a simple device made out of NM/FM bilayer may be capable of both writing and reading without any additional (third) terminal or MTJ structure. USMR may also be present in TI/FM systems, thus making the example techniques applicable in the same way for TI/FM devices.

This disclosure describes examples of combining the spin-orbit torque switching by SHE or TIs as writing mechanism with USMR as a reading mechanism for a simple, yet potentially powerful design of a memory/logic device featuring only two terminals. This allows the use of more efficient spin-orbit torque (SOT) switching while still keeping the device at minimal two terminals so that it can be easily embedded into mature crossbar memory architectures, with or without selectors, which are used, for example, with MTJs in STT-RAM.

As described above, the unidirectional resistance refers to the combined resistance of the magnet and the spin-orbital coupling channel. The magnetization direction of the magnet sets the resistance of the combination of the magnet and the spin-orbital coupling channel (e.g., by setting the interface of magnet and the spin-orbital coupling channel), and therefore, the resistance is not based on the magnetization direction of the magnet relative to a magnetization direction of another layer (sometimes called fixed layer for MTJs).

FIG. 1 is a conceptual diagram illustrating an example of spin Hall effect. In the illustrated example, a charge current (Jc) is passed through a spin-orbital coupling channel 102. In some examples, spin-orbital coupling channel 102 may be a spin Hall channel, a spin channel that provides a Rashba effect with a magnet, or a channel that provides a unidirectional interface effect to induce the USMR effect. Due to the spin orbit interactions (SOI), electrons 114 of different spin directions are deflected in directions that are at right angles to their spins. As illustrated in FIG. 1, electrons deflected up/down carry spins pointing to right/left, respectively. At the surface/interface of the spin-orbital coupling channel 102, these spin-polarized electrons accumulate, which is referred to as spin accumulation. The accumulated spins of electrons 102 can potentially exert a torque on magnet 104 if the magnet 104 is in close contact to a surface of the spin-orbital coupling channel 102. The torque may switch the magnetization state (e.g., magnetization direction) of the magnet 104.

Figure 2A:
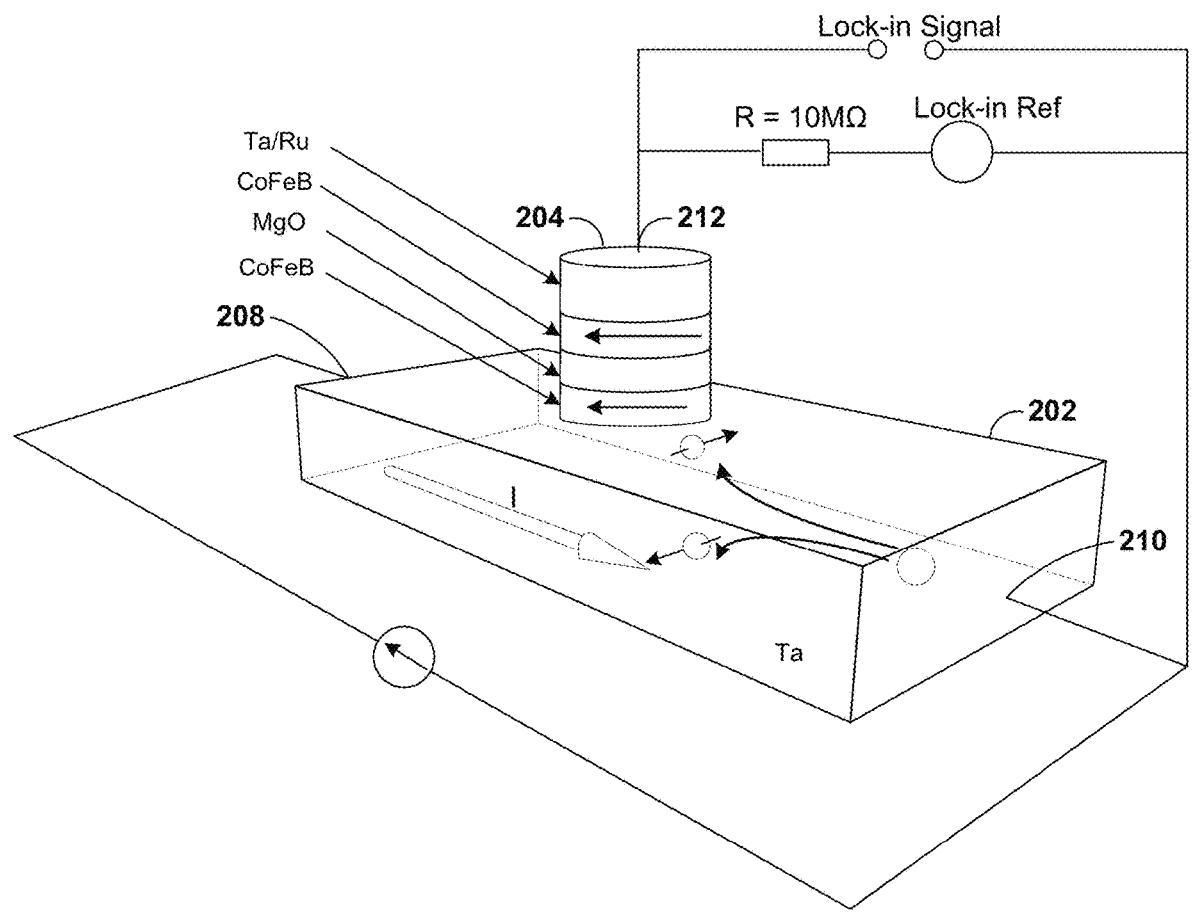
FIG. 2A is a block diagram illustrating an example of a three-terminal spintronic device.

FIG. 2A is a block diagram illustrating an example of a three-terminal spintronic device. FIG. 2A illustrates an MTJ 204 that includes a CoFeB fixed layer, a MgO insulation layer, and a CoFeB free layer. The magnetization direction (e.g., magnetization state) of the MTJ 204, and particularly the CoFeB free layer, changes based on the flow of the current through the spin-orbital coupling channel 202. As illustrated, spin-orbital coupling channel 202 is formed by Ta. Other example materials for MTJ 204 and spin-orbital coupling channel 202 are possible. Spin Hall effect can completely switch the magnetization of the free layer of an in-plane magnetic layer (e.g., CoFeB free layer of MTJ 204).

Figure 2B:
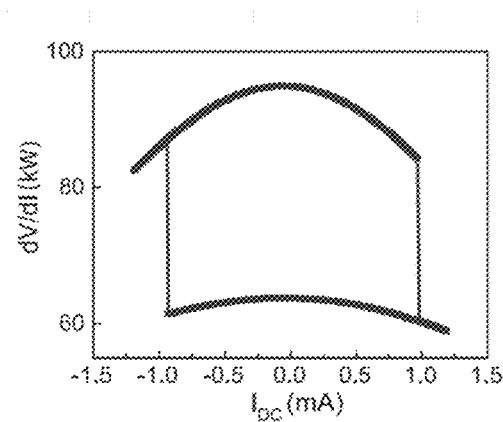
FIG. 2B is a graph illustrating a change in resistance of the device of FIG. 2A as a function of current.

FIG. 2B is a graph illustrating a change in resistance of the device of FIG. 2A as a function of current. The resistance of MTJ 204 of FIG. 2A may be based on the whether the magnetization of the free layer and the fixed layer are in the same direction (referred to as parallel state) for low impedance, or in opposite direction (referred to as anti-parallel) for high impedance. FIG. 2B illustrates that is possible to change the magnetization direction of the free layer based on the current flowing through the spin-orbital coupling channel 202.

MTJ 204 may be used for purposes of writing a digital value that is subsequently read. In this way, MTJ 204 may function as part of a memory cell. For instance, the resistance of the MTJ 204 may be associated with a digital value. When the MTJ 204 has a high resistance, then the MTJ 204 may be associated with a first digital value (e.g., digital high or digital low), and when the MTJ 204 has a low resistance, then the MTJ 204 may be associated with a second digital value (e.g., the other of the digital high or digital low).

A controller circuit (not illustrated) may output a current through the spin-orbital coupling channel 202 that sets the MTJ 204 into the parallel state or anti-parallel state. For instance, the current may flow through terminals 208 and 210. When MTJ 204 is in the parallel state, the MTJ 204 may be considered as storing the first digital value, and when MTJ 204 is in the anti-parallel state, the MTJ 204 may be considered as storing the second digital value. In this example, a first terminal 208 may be the input into the spin-orbital coupling channel 202, and a second terminal 210 may be the output of the spin-orbital coupling channel 202. By setting the MTJ 204 to parallel or anti-parallel, the controller circuit may effectively write a first or a second digital value.

To read the digital value, the controller circuit may output a current through the MTJ 204 via terminal 212 and measure the voltage. If the MTJ 204 is in the parallel state, then the voltage will be at a first voltage value because the resistance of the MTJ 204 will be low, and if the MTJ 204 is in the anti-parallel state, then the voltage will be a second voltage value because the resistance of the MTJ 204 will be high. Accordingly, by measuring the voltage, the controller circuit may determine the resistance of the MTJ 204, and hence, the digital value stored by the MTJ 204. In this example, the terminal through which the current flows through the MTJ 204 is a third terminal 212, meaning that the example illustrated in FIG. 2A is for a three-terminal device.

Accordingly, in the example illustrated in FIG. 2A, three terminals may be needed for writing and reading. This disclosure describes example techniques to reduce from three terminals for writing and reading, to using two-terminals for writing and reading.

While spin Hall effects may have led to many memory and logic device concepts and demonstrations, the devices may be for three-terminal devices. Developing three-terminal devices, including the MTJ structure may be complicated and may not suitable for cross-bar memory and 3D memory architecture. For example, forming such stacks of MTJ structures on top of one another or in a cross-bar architecture may be complicated and may not result in consistent structures exhibiting the same properties.

This disclosure describes examples of two-terminal spintronic devices. To achieve two-terminal spintronic devices, the disclosure describes using unidirectional spin Hall magnetoresistance (USMR) effects. In USMR, the resistance of a spin-orbital coupling channel, a magnet, and the interface between the channel and the magnet, is set based on the current through a spin-orbital coupling channel. However, no additional terminal is needed to determine the resistance of the magnet. Rather, a current through the spin-orbital coupling channel can be used to determine the voltage across the channel, magnet, and interface, and hence the resistance of the channel, magnet, and interface.

Figure 3A:
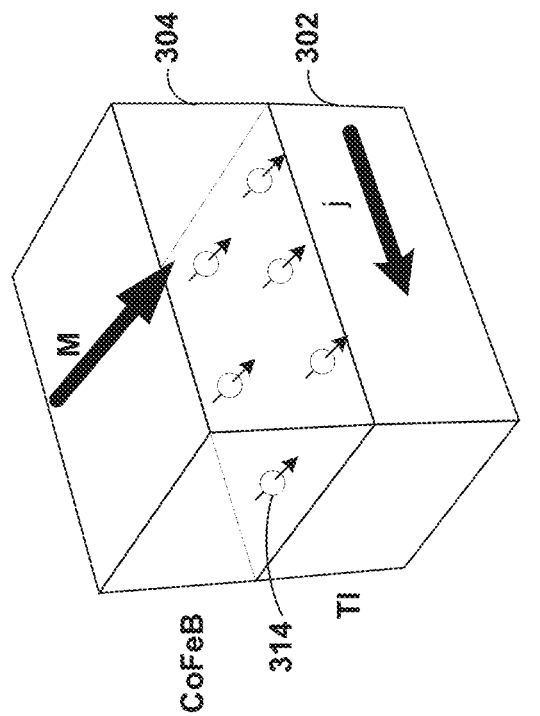
FIGS. 3A and 3B are conceptual diagrams illustrating unidirectional spin Hall magnetoresistance (USMR) effects.
Figure 3B:
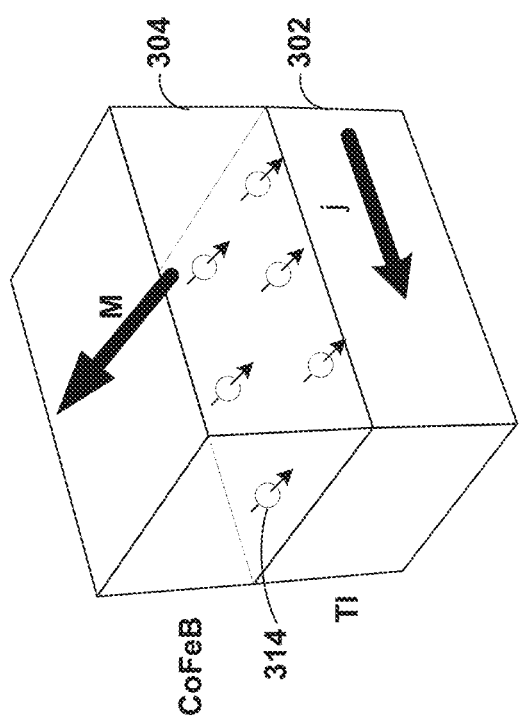

FIGS. 3A and 3B are conceptual diagrams illustrating unidirectional spin Hall magnetoresistance (USMR) effects. Spins are generated at an interface of a non-magnetic layer 302 (e.g., a topological insulator (TI)) and a magnetic layer 304 (e.g., CoFeB) when a charge current (j) is applied to the non-magnetic layer 302. The relative directions of spins to magnetization of either parallel or anti-parallel result in different resistance states or levels. For example, as illustrated in FIG. 3A, the spin of electrons 314 is anti-parallel to the magnetization direction of magnetic layer 304, which may in some examples correspond to a high resistance level. In the example of FIG. 3B, the spin of electrons 314 is parallel to the magnetization direction of magnetic layer 304, which may correspond to a low resistance level. A high resistance level (e.g., greater than or equal to a threshold resistance) may correspond to a first digital value (e.g., one of a digital high or a digital low), while a low resistance level (e.g., less than a threshold resistance) may correspond to a second digital value (e.g., the other one of a digital high or a digital low). In contrast to conventional three-terminal devices that utilize an MTJ where the resistance is based on the magnetization direction of a free magnet relative to the magnetization direction of a fixed magnet (e.g., the fixed magnet acts as a reference), according to techniques of this disclosure, the resistance is based on the magnetization direction of a single magnet relative to the spin direction of electrons in the spin-orbital coupling channel. In other words, the unidirectional resistance is not based on the magnetization direction of the magnet relative to a magnetization direction of another magnet. Said yet another way, the reference direction may be the direction of the electron spins of the spin-orbital coupling channel and not the direction of a reference magnet.

The USMR originates from the spin accumulation at the FM (ferromagnetic)/NM (non-magnetic) interface induced by spin Hall effect. It is unique compared to anisotropic magnetoresistance or spin Hall magnetoresistance due to its angular symmetry. It may be one of few (possibly only) type of magnetoresistance in a FM/NM structure that gives sensitivity to magnetization states that are opposite to each other. For example, tunneling magnetoresistance (e.g., such as in an MTJ) may require an additional reference FM.

Figure 4A:
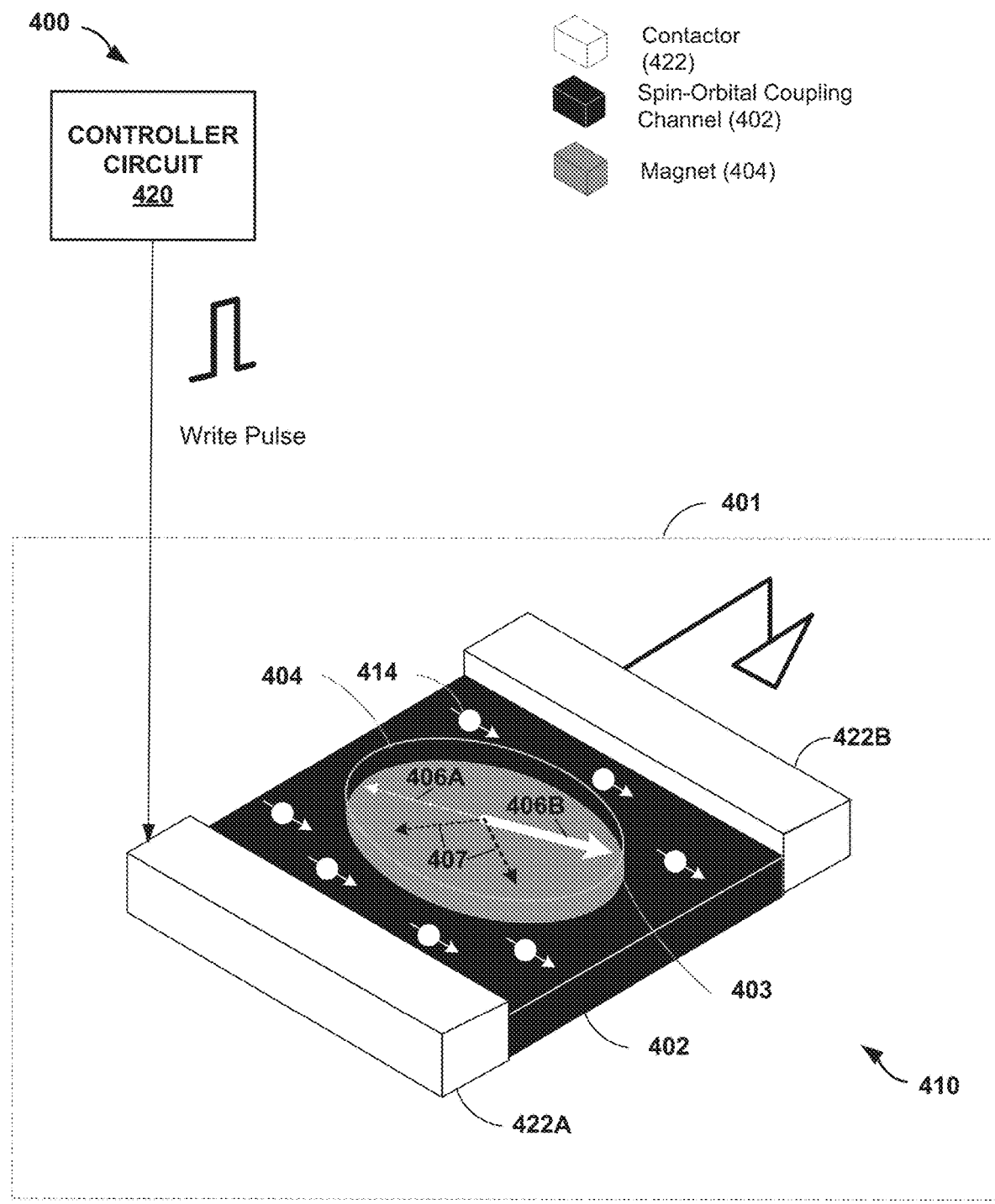
FIGS. 4A and 4B are conceptual diagrams illustrating writing to and reading from, respectively, a two-terminal spintronic device.
Figure 4B:
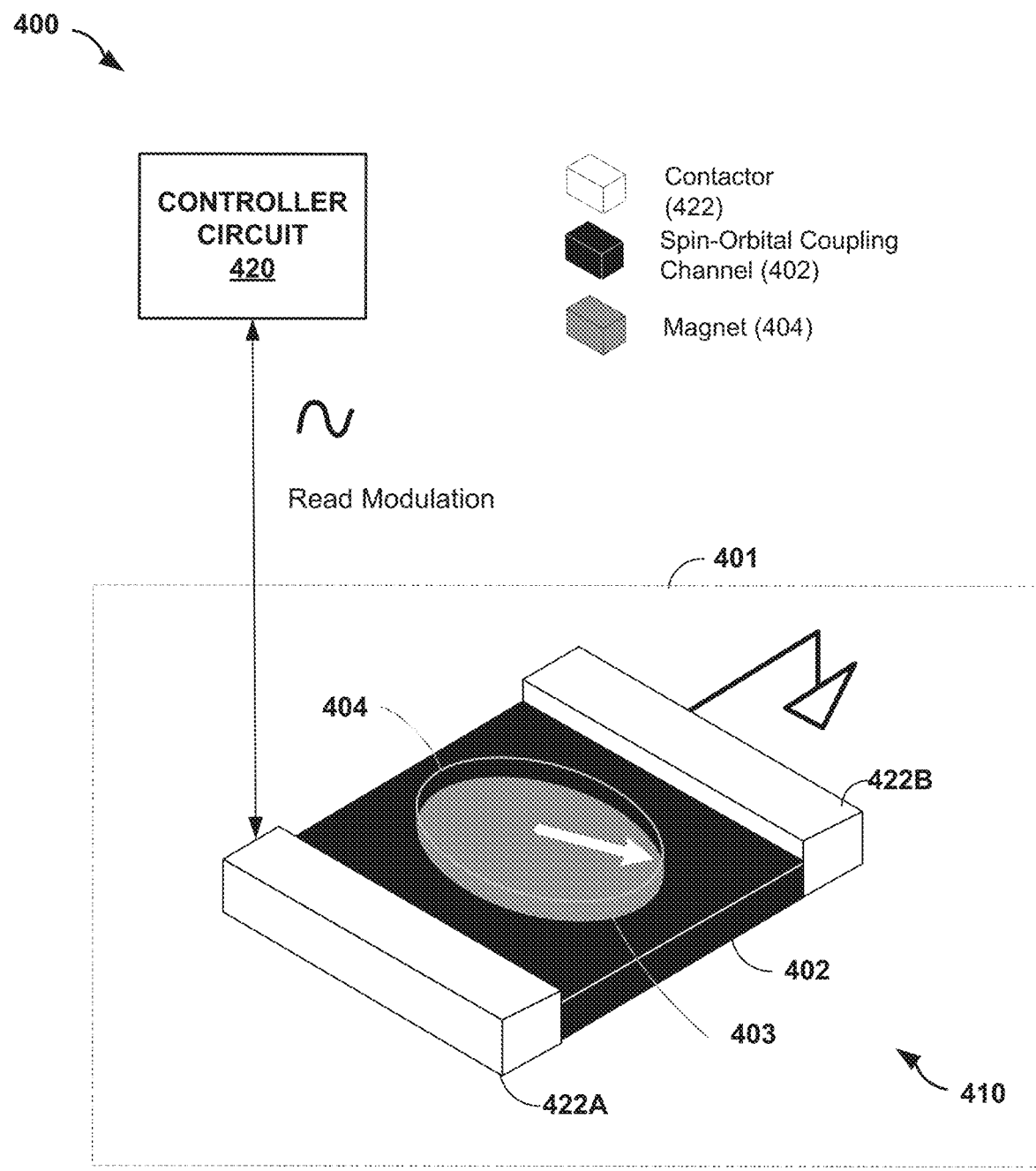

FIGS. 4A and 4B are conceptual diagrams illustrating an example system 400 for writing to and reading from, respectively, a two-terminal spintronic device. For instance, FIGS. 4A and 4B illustrate the combination of spin Hall effect induced switching and USMR for two-terminal memory device. System 400 includes two-terminal memory device 401 and controller circuit 420.

In some examples, two-terminal memory device 401 includes contacts 422A and 422B (collectively, contacts 422), and structure 410. Structure 410 includes spin-orbital coupling channel (e.g., a spin hall channel) 402 and magnet 404. Contacts 422A and 422B may include any conductive material and may be configured to transport a voltage or current from controller circuit 420 through spin-orbital coupling channel 402. In other words, contacts 422A and 422B may function as terminals for two-terminal memory device 401.

Spin-orbital coupling channel 402 may include non-magnetic material, such a heavy metal (e.g., Tungsten (W), Tantalum (Ti), Platinum (Pt)) or their alloys or their multi-layers, a topological insulator (TI), a doped topological insulator, or a combination therein. In some examples, a topological insulator may include $Bi_2Se_3$ or $(BiSb)_2Te_3$.

Magnet 404 may include a ferromagnetic material (e.g., Fe, CoFeB). The magnet 404 may not need to be tailored differently from spin-orbital coupling channel 402 (e.g., magnet 404 and spin-orbital coupling channel 402 may be the same shape or different shapes) as the spin-orbital coupling channel 402 since the effects may be based on the interface 403, or boundary, between spin-orbital coupling channel 404 and magnet 404. For example, a spin hall current along the surface of spin-orbital coupling channel 402 may exert a spin torque along the interface of spin-orbital coupling channel 402 and magnet 404, which may change the magnetization state of magnet 410, and hence the resistance of structure 410. For instance, changing the magnetization of magnet 404 may change the resistance at the interface 403 between magnet 404 and spin-orbital coupling channel 402, such that the resistance of structure 410 changes.

In accordance with techniques of this disclosure, controller circuit 420 may control write operations to, and read operations from, two-terminal memory device 401. Controller circuit 420 may include one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

As illustrated in FIG. 4A, the initial magnetization direction of magnet 404 may be illustrated by a dashed arrow 406A. Different magnetization directions of magnet 404 may correspond to different resistance levels (e.g., a high resistance level or a low resistance level) of structure 410. The resistance level of structure 410 may be considered to be a high resistance level when the resistance satisfies (e.g., is greater than or equal to) a first threshold resistance and may be considered to be a low resistance level when the resistance does not satisfy (e.g., is less than) a second threshold resistance. The first threshold resistance and the second threshold resistance may be the same resistance value, or may be different resistance values. Each resistance level may correspond to a different digital value, such as a digital high (e.g., a "1") or a digital low (e.g., "0"). In other words, the resistance value may represent, or be indicative of, a digital value. In some examples, a high resistance level corresponds to a digital high and a low resistance level corresponds to digital low. In some examples, a high resistance level corresponds to a digital low and a low resistance level corresponds to digital high.

To write, controller circuit 420 may apply a strong pulse (e.g., greater than or equal to a threshold current density) across the two-terminal memory device 401 so that spins of electrons 414 are generated by spin Hall effect in the channel 402 and are absorbed by the top magnet 404. In other words, controller circuit 420 may apply a write current to spin-orbital coupling channel 402 by applying a strong pulse to two-terminal memory device 401. In response to controller circuit 420 applying the write current across two-terminal device 401, the magnetization (illustrated by the bolded white arrow 406B) then is switched from left to right (block lines illustrate an example of one possible trajectory 407). In some examples, a resistance level of spin-orbital coupling channel 402 and a resistance level of magnet 404 may be constant, while a resistance level of an interface 403 between channel 402 and magnet 404 may vary based on the magnetization direction of magnet 404 (e.g., the resistance of interface 403 may be unidirectional). The resistance level of structure 410 includes the resistance of channel 402, the resistance of magnet 404, and the resistance of interface 403. In some examples, controller circuit 420 changes the overall resistance level of structure 410 by changing the magnetization direction of magnet 404 (e.g., which may change the resistance at the interface 403 between magnet 404 and spin-orbital coupling channel 402), which may change the overall resistance level of structure 410, and hence change the digital value represented by the magnetization state of magnet 404. Because the resistance level of structure 410 is unidirectional and is based on the magnetization direction of magnet 404, the resistance level structure 410 may be a first resistance level when a magnetization direction of the magnet 404 is a first direction (e.g., 0 degrees) and a second resistance level when the magnetization direction of the magnet 404 is 180 degrees opposite the first direction (e.g., 180 degrees).

For instance, when the initial magnetization direction of magnet 404 causes the resistance level of structure 410 to be a first resistance level (e.g., greater than a threshold resistance), such that the magnetization state may represent a first digital value (e.g., digital high). Responsive to receiving a write current, the magnetization direction of magnet 404 may change, which may cause the resistance of structure 410 to change (e.g., by changing the resistance of the interface 403) from a first resistance level to a second resistance level, such that the magnetization state may represent a second digital value (e.g., digital low).

To read, controller circuit 420 may apply a mild current (e.g., less than the threshold current density), and the controller circuit 420 may determine the voltage signal across the structure 410. In other words, controller circuit 420 may apply a read current to spin-orbital coupling channel 402 to determine the voltage across structure 410 (e.g., the voltage across spin-orbital coupling channel 402, magnet 404, and the interface between channel 402 and magnet 404). The mild current may be sine wave modulation. The measured voltage, and hence resistance, indicates the state of the magnet 404. Said differently, by measuring the voltage across structure 410, controller circuit 420 may determine the resistance level of structure 410, and hence the digital value represented by magnet 404. Applying the read current to channel 402 may enable controller circuit 420 to determine the magnetization state of magnet 404 without utilizing a third terminal, such that two-terminal spintronic device 401 may function as a memory or logic device with only two terminals.

Figure 5B:
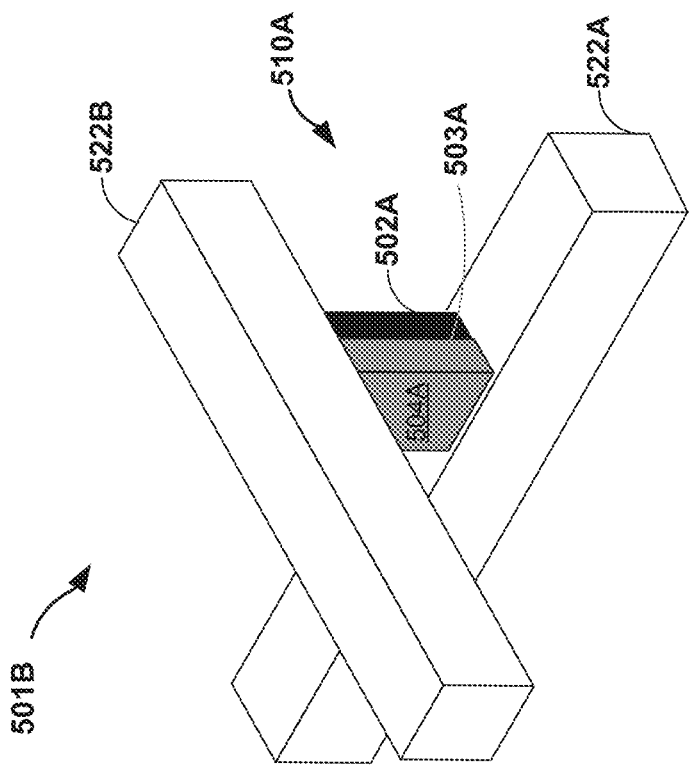
FIGS. 5A-5C are conceptual diagrams illustrating examples of crossbar and 3D architectures for memory devices using two-terminal spintronic devices.
Figure 5A:
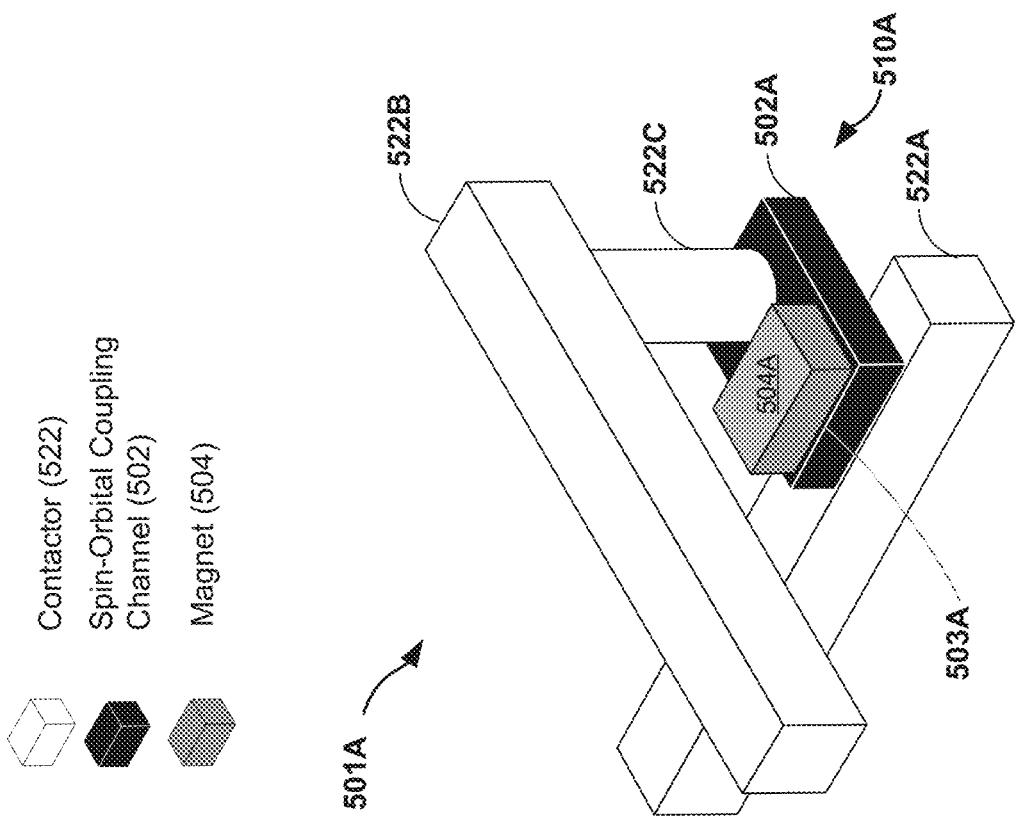
Figure 5C:
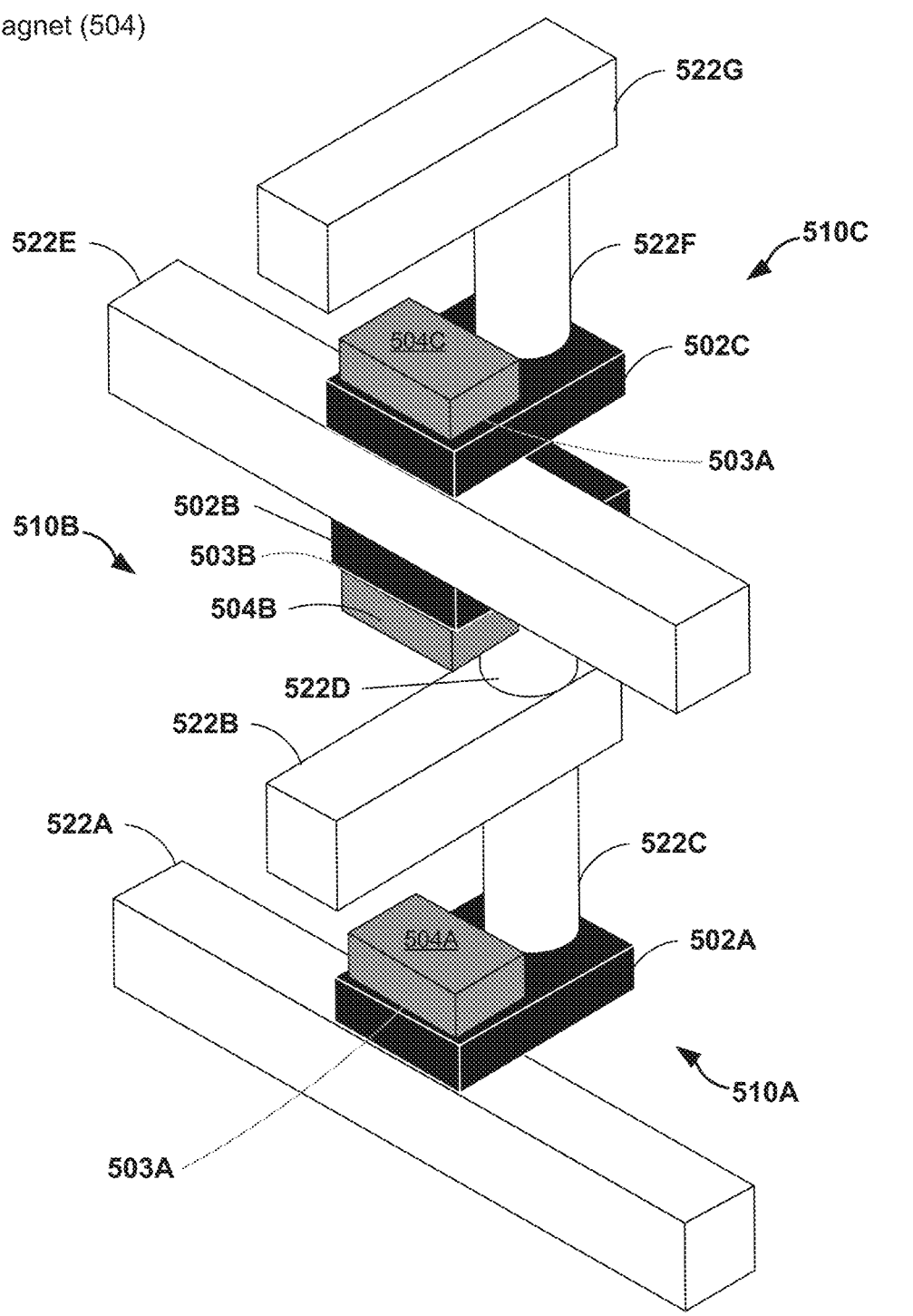

FIGS. 5A-5C are conceptual diagrams illustrating examples of crossbar and 3D architectures for memory or logic devices using two-terminal spintronic devices. With the two terminals, the example devices described in this disclosure may be embedded into crossbar architectures (FIGS. 5A and 5B) or 3D architectures (FIG. 5C). In accordance with some examples, two-terminal devices without a selector may be added without adding the third set of contact lines to support read operations (e.g., in contrast to devices with an MTJ without a selector which may use three sets of contact lines or terminals). As another example, two terminal devices with a selector may be added without adding a fourth set of lines to support read operations (e.g., in contrast to devices with an MTJ and selector which may use four sets of lines or terminals). In some examples, a selector includes a switch (e.g., a transistor) connected to the controller via a contact line or terminal and enables the controller to selectively read the memory or logic device by allowing current to flow through the memory or logic device when the selector is activated (e.g., the switch on) and preventing current from flowing through the memory or logic device when the selector is inactive (e.g., the switch is off).

In other words, according to techniques of this disclosure, the memory or logic devices may include one less terminal compared to devices that utilize MTJs. The two-terminal devices may provide better compatibility with the current peripheral circuitries found in STT-RAM for write and read operations, and with higher density as compared to three-terminal designs. Also, given proper thin film growth processes, the device may be made vertically, which allows for even higher areal density.

Electric field and strain effects may also be used to further assist with switching with the techniques described in this disclosure. The techniques may keep the device to minimal two terminals which makes it easy to adopt with the current STT-RAM technologies. The device can be made with a bilayer sandwich structure to further ease the fabrication effort.

Accordingly, this disclosure describes examples of a device (e.g., memory or logic device) with two-terminal write and read operations that acts like an MTJ but carries greater switching efficiency as spin Hall effect is utilized. The two-terminal device may support magnetic cross-bar and 3D memory architectures.

FIGS. 5A, 5B, and 5C illustrate example memory (or logic) devices 501A, 501B, and 501C, respectively (collectively, memory devices 501). Memory devices 501A and 501B are illustrated in a crossbar architecture. Each device of memory devices 501A and 501B includes a first contactor (also referred to as a contact line or terminal) 522A, a second contactor 522C, and a structure 510A that includes spin-orbital coupling channel 502A and magnet 504A. In some examples, as illustrated in FIG. 5A, memory device 501A may include a third contactor.

Spin-orbital coupling channel 502 and magnet 504 may be aligned horizontally (e.g., as illustrated in FIG. 5A) or vertically (e.g., as illustrated in FIG. 5B). In some examples, when spin-orbital coupling channel 502A and magnet 504A are aligned horizontally, an interface 503A between spin-orbital coupling channel 502A and magnet 504A may define a plane that is substantially parallel to a plane defined by the interface between magnet 504A and first contactor 522A. As another example, when spin-orbital coupling channel 502A and magnet 504A are aligned vertically, an interface 503A between spin-orbital coupling channel 502A and magnet 504A may define a first plane that is substantially perpendicular to a second plane defined by the interface between magnet 504A and first contactor 522AA, a third plane defined by the interface between spin-orbital channel 502A and first contactor 522A, or both. In some examples, the second plane and the third plane are substantially planar with one another.

In some examples, magnet 504A may be not be directly coupled to any of the contactors or may be directly coupled to a single contactor. For example, as illustrated in FIG. 5A, magnet 504A may be coupled to the contactors indirectly (e.g., via magnet 504A). In some examples, spin-orbital coupling channel 502A and magnet 504A are each directly coupled to at least one contactor (e.g., first contactor 522A, second contactor 522B, or both). For example, as illustrated in FIG. 5A, spin-orbital coupling channel 502A may be directly coupled to two contactors (e.g., first contactor 522A and third contactor 522C), and as illustrated in FIG. 5B, spin-orbital coupling channel 502A and magnet 504A may each be directly coupled to first contactor 522A and second contactor 522B. In some examples, the spin-orbital coupling connector is directly coupled to one contactor (e.g., as illustrated in FIG. 6B).

FIG. 5C illustrates an example memory device 501C in a 3D architecture. In some examples, a memory or logic device may include a plurality of spin-orbital coupling channels and magnets. For instance, device 501C includes spin-orbital coupling channels 502A-502C (collectively, spin-orbital coupling channels 502) and magnets 504A-504C (collectively, magnets 504). Structure 510A includes spin-orbital coupling channel 502A and magnet 504A, structure 510B includes spin-orbital coupling channel 502B and magnet 504B, and structure 510C includes spin-orbital coupling channel 502C and magnet 504C. In the examples of FIGS. 5A-5C, a top contactor (e.g., contactor 522A) and a bottom contactor (e.g., contactor 522B) may sandwich a spin-orbital coupling channel (e.g., spin-orbital coupling channel 502A) and a magnet (e.g., magnet 502A). In other words, spin-orbital coupling channel 502A and magnet 504A may be located between two contactors. In some instance, a third contact line or via (e.g., contactor 522C) and/or a selector (e.g., as illustrated in FIGS. 6A-6D) may also be located between the two contactors. As illustrated in FIG. 5C, spin-orbital coupling channel 502A and magnet 504A are aligned horizontally such that an interface 503A between spin-orbital coupling channel 502A and magnet 504A may define a plane that is substantially parallel to a plane defined by the interface between magnet 504A and first contactor 522A. Similarly, interfaces 503B and 503C may also define planes that are substantially parallel to planes defined between the respective magnets and contactors. However, in some examples, such as illustrated in FIG. 7B, a spin-orbital coupling channel and magnet may be aligned vertically, such that an interface between the spin-orbital coupling channel and magnet defines a plane that is substantially perpendicular to a plane defined by the interface between the magnet and first contactor and the interface between the spin-orbital channel and the first contactor.

As one example, the disclosure describes a device that includes a spin-orbital coupling channel (e.g., 502A) configured to receive a write current and a read current, a magnet (e.g., 504A) coupled to the spin-orbital coupling channel, wherein the magnet and spin-orbital coupling channel exhibit unidirectional spin Hall magnetoresistance (USMR) effects, and a controller circuit (e.g., controller circuit 420 illustrated in FIGS. 4A-4B). The controller circuit 420 may be configured to output the write current through the spin-orbital coupling channel 502A to set a magnetization direction of the magnet 504A, which may set the resistance of structure 510 (e.g., by changing the resistance of interface 503A) to a first resistance level indicative of a first digital value or a second resistance level indicative of a second digital value, and output the read current through the spin-orbital coupling channel 502A to determine whether the resistance of structure 510 is at the first resistance level or the second resistance level, without outputting a current through the magnet 504A.

In some examples, the controller circuit is configured to determine a voltage across structure 510A that includes spin-orbital coupling channel 502A and the magnet 504A, and determine whether the resistance of the structure 510A is at the first resistance level or the second resistance level based on the voltage across the structure 510A. The write current may be at a first current density greater than or equal to a threshold current density for setting a magnetization direction of the magnet, and the read current may be at a second current density less than the threshold current density. The magnetization direction includes one of a first magnetization direction for which the resistance of the structure 510 is the first resistance level, or a second magnetization direction for which the resistance of the structure 510 is the second resistance level. The spin-orbital coupling channel may be formed from a topological insulator or a heavy metal in some examples.

The spin-orbital coupling channel 502A may be a first spin-orbital coupling channel, the magnet 504A may be a first magnet, the write current may be a first write current, and the read current may be a first read current. In some examples, such as the example illustrated in FIG. 5C, the device may also include at least a second spin-orbital coupling channel 502B configured to receive a second write current and a second read current, and at least a second a magnet 504B coupled to the second spin-orbital coupling channel 502B, wherein the second magnet and second spin-orbital coupling channel exhibit the USMR effects (e.g., unidirectional resistance at the interface 503B). The controller may be configured to output the second write current through the second spin-orbital coupling channel 502B to set a resistance of the structure 510B to the first resistance level indicative of the first digital value or the second resistance level indicative of the second digital value, and output the second read current through the second spin-orbital coupling channel 502B to determine whether the resistance of the structure 510B is at the first resistance level or the second resistance level, without outputting a current through the second magnet. As one example, the first magnet and first spin-orbital coupling channel may be arranged in a crossbar configuration with the second magnet and second spin-orbital coupling channel. As another example, the first magnet and first spin-orbital coupling channel are arranged on top of the second magnet and second spin-orbital coupling channel from a 3D memory architecture.

FIGS. 6A-6D are conceptual diagrams illustrating examples of memory cell layouts. Each memory cell of memory cells 601A-601D (collectively, memory cells 601) includes a bottom contact line 622A and a top contact line 622B. In some examples, a memory cell includes a third contact line 622C, also referred to as a via. In some examples, each memory cell includes a spin-orbital coupling channel 602, magnet 604, and selector 606.

FIG. 6A illustrates an example memory cell 601A where the spin-orbital coupling channel 602 is coupled to the bottom contact line 622A. The magnet 604 is coupled to the spin-orbital coupling channel 602 at interface 603. A via 622C is also coupled to the spin-orbital coupling channel 602. A selector 606 is coupled to, or is located within, the via 622C, and couples to the top contact line 622B.

FIG. 6B illustrates an example memory cell 601B where the spin-orbital coupling channel 602 is coupled to the bottom contact line 622A. The magnet 604 is coupled to the spin-orbital coupling channel 602 at interface 603, and the selector line 606 is coupled to the spin-orbital coupling channel 602. A via 622C is coupled to the selector line 606 and the top contact line 622B.

FIG. 6C illustrates an example memory cell 601C where the selector line 606 is coupled to the bottom contact line 622A, and the spin-orbital coupling channel 602 is coupled to the top of the selector line 606. The magnet 604 is coupled to the top of the spin-orbital coupling channel 602 at interface 603. A via 622C is coupled to the spin-orbital coupling channel 602 and to the top contact line 622A.

FIG. 6D illustrates an example of a vertical memory cell 601D. A selector line 606 is coupled to the bottom contact line 622A. The magnet 604 and spin-orbital coupling channel 602 are arranged vertically relative to and on top of the selector line 606. The magnet 604 and spin-orbital coupling channel 602 are coupled to one another at interface 603. A top contact line 622B is coupled to the magnet 604 and spin-orbital coupling channel 602. Selector 606 may be directly coupled to bottom contact line 622A, spin-orbital coupling channel 602, and magnet 604. Spin-orbital coupling channel 602 may be directly coupled to magnet 604 and top contact line 622B. Similarly, magnet 604 may also be directly coupled to top contact line 622B. In some examples, spin-orbital coupling channel 602 and magnet 604 are aligned vertically, such that an interface 603 between the spin-orbital coupling channel 602 and magnet 604 defines a plane that is substantially perpendicular to a plane defined by the interface between the magnet 604 and bottom contact line 622A and the interface between the spin-orbital channel 602 and the bottom contact line 622A.

The examples illustrated in FIGS. 5A-5C and FIGS. 6A-6D are provided as a few examples and should not be considered limiting. There may be other configurations using USMR effects for constructing memory or logic cells and the techniques are not limited to the examples provided in this disclosure.

Figure 7A:
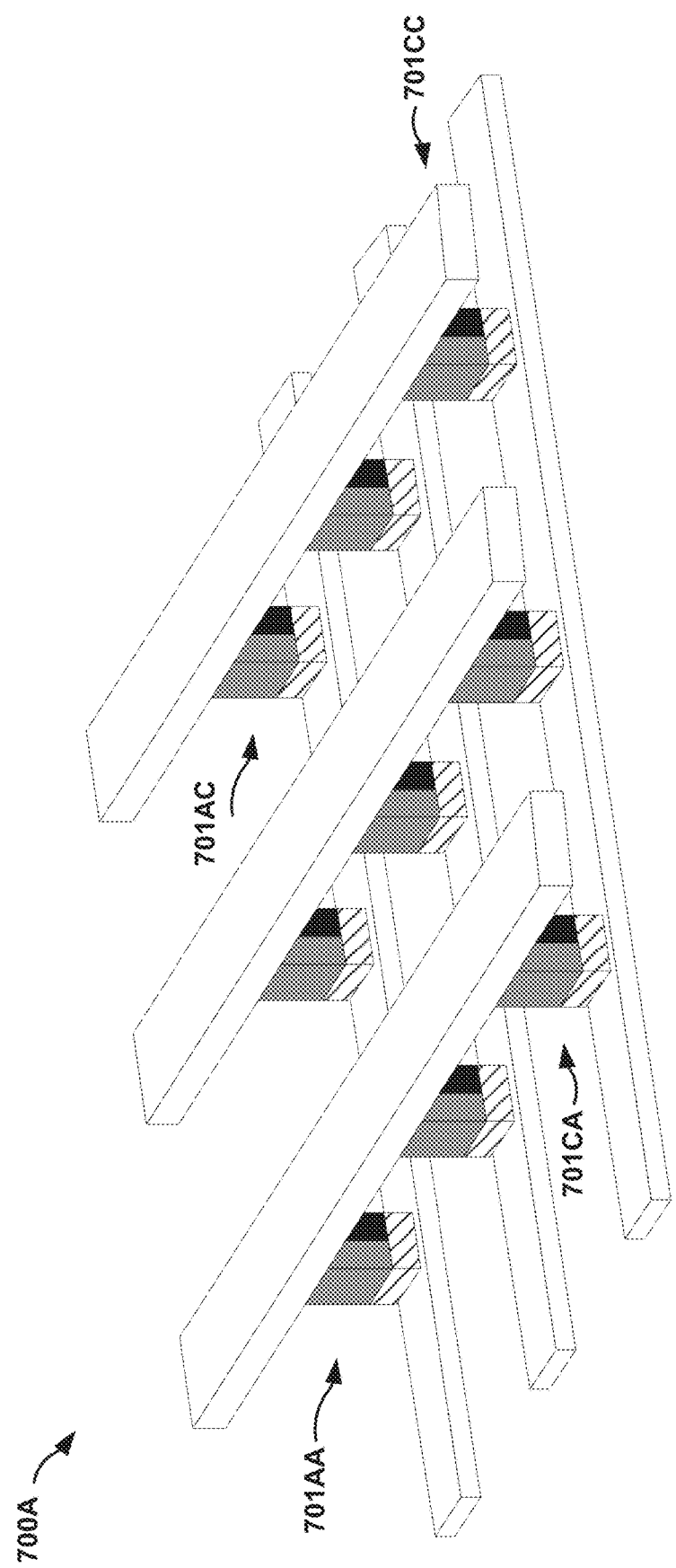
FIGS. 7A and 7B are conceptual diagrams illustrating examples of cross bar memory architecture.
Figure 7B:
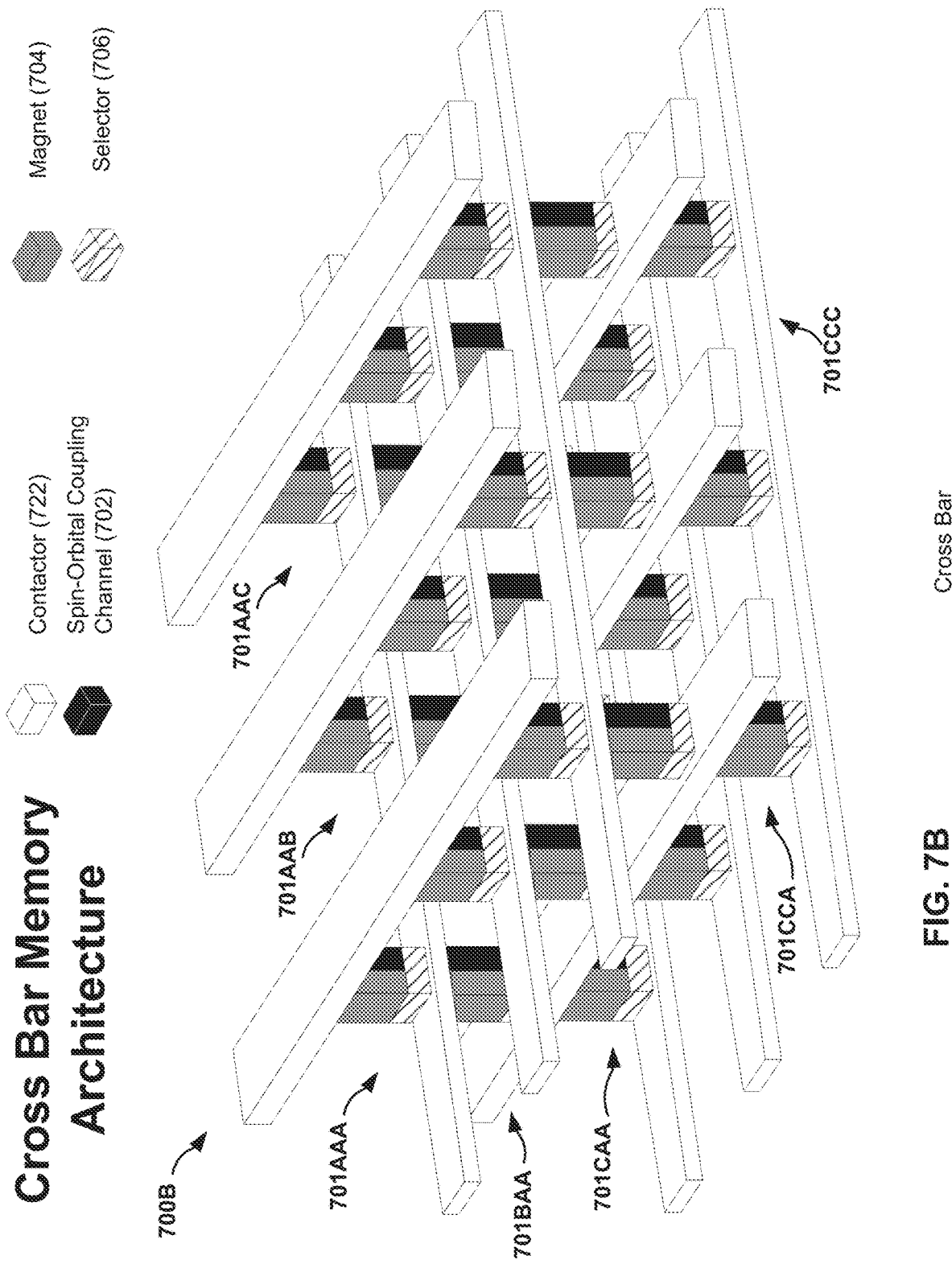

FIGS. 7A and 7B are conceptual diagrams illustrating examples of cross bar memory architecture. FIG. 7A illustrates an example of a cross bar memory device 700A that includes a plurality of vertical memory cells 701AA-701CC (collectively, memory cells 701) such as those illustrated in FIG. 6D. While cross bar memory device 700A includes three top contact lines and three bottom contact lines with a total of nine memory cells 701, cross bar memory device 700A may include any number of top/bottom contact lines 722 and memory cells 701.

FIG. 7B illustrates an example of a cross bar memory device 700B that includes a plurality of vertical memory cells 701AAA-701CCC (collectively, memory cells 701) in a 3D architecture. For instance, there may be stacks of cross bars on top of one another. While 3D cross bar memory device 700B includes three levels of memory cells stacked on top of one another (with each level including three top contact lines and three bottom contact lines with a total of nine memory cells 701 per level), cross bar memory device 700B may include any number levels, where each level may include any number of top/bottom contact lines 722 and memory cells 701.

In the examples of FIGS. 7A and 7B, each memory cell of memory cells 701 includes a selector directly coupled to a bottom contact line, a spin-orbital coupling channel, and a magnet. Each spin-orbital coupling channel may be directly coupled to a respective magnet and top contact line. Similarly, each magnet may be directly coupled to the respective top contact line. As illustrated in FIGS. 7A and 7B, each interface between a respective spin-orbital coupling channel and magnet defines a plane that is substantially perpendicular to a plane defined by an interface between the magnet and bottom contact line and the interface between the spin-orbital channel and the bottom contact line.

Although FIGS. 7A and 7B are illustrated with vertical cells like those illustrated in FIG. 6D, the techniques are not so limited. In general, the various example memory cells described in this disclosure may be useable for cross bar architecture, and the example of using the vertical cell is provided as one example to assist with understanding.

FIG. 8A is a conceptual diagram illustrating an example of nanowire cell. In some examples, a memory cell may be formed by nanowire of spin Hall/magnetic material shelled in magnetic/spin Hall material. In this example, magnetization is then left/right hand circular representing information stored (e.g., left hand circular represents a first digital value, and right hand circular represents a second digital value). For example, FIG. 8A illustrates a nanowire memory cell 850A that includes a spin-orbital coupling channel 802 surrounded by magnet 804 and a nanowire memory cell 850B that includes a spin-orbital coupling channel 802 surrounding magnet 804. Circular magnetization configurations may still provide high/low USMR resistance states since the relative directions between local magnetic moments and spins may be either parallel or anti-parallel.

FIG. 8B is a conceptual diagram illustrating an example of nanowire memory cells in cross bar memory device 800.

In some examples, cells may be made vertical with nanowires to further improve lateral density. As illustrated in FIG. 8B, memory device 800 includes a plurality of nanowire cells 850A. However, memory device 800 may include nanowire memory cells 850B in addition to, or in place of, nanowire memory cells 850A. While memory device 800 include nine memory cells in a single level, memory device 800 may include any number of levels (e.g., a 3D architecture) with any number of memory cells per level. Thus, a memory device 800 may include a plurality of nanowire cells 850 that each act as a memory device to store digital values (e.g., digital high or digital low).

Figure 9A:
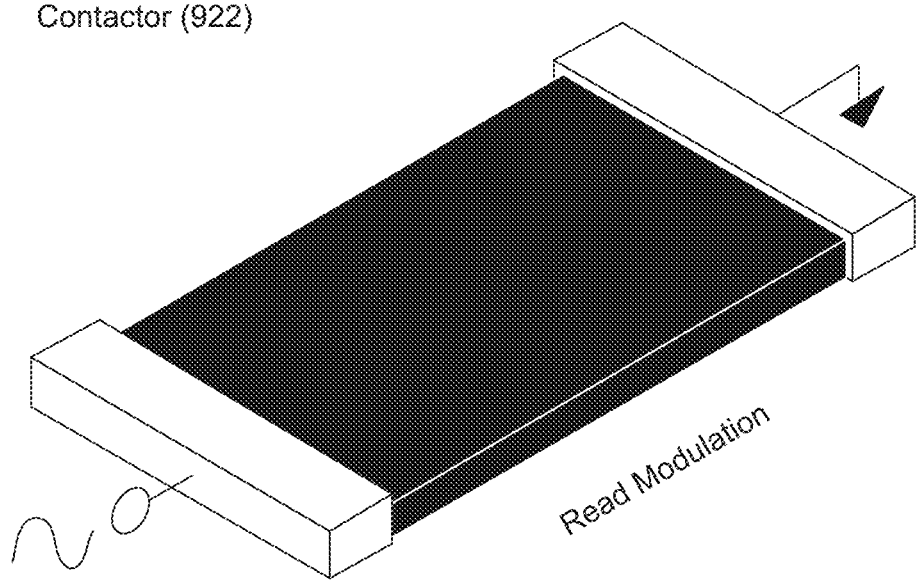
FIGS. 9A an 9B are conceptual diagrams illustrating an example for sensing magnetic nano-particles.
Figure 9B:
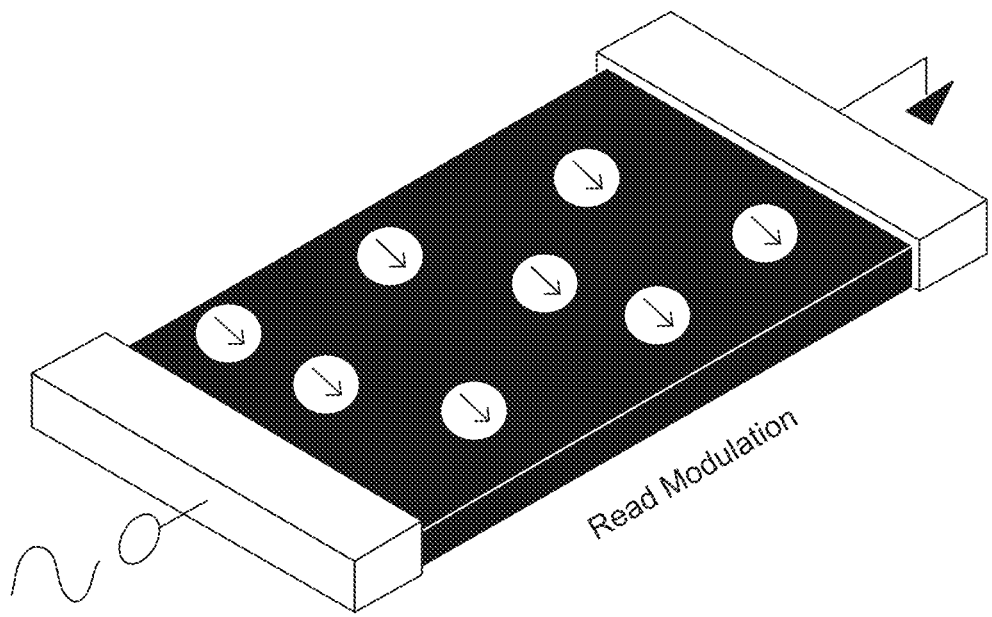
FIG. 9C is a graph illustrating example threshold for sensing presence of magnetic nano-particles.

FIGS. 9A an 9B are conceptual diagrams illustrating an example technique for sensing magnetic nano-particles. For instance, the example techniques described in this disclosure may be used to detect proximity of magnetic particles using USMR. When magnetic particles 904 are absent (e.g., not proximate to the spin-orbital coupling channel, as illustrated in FIG. 9A), the spin-orbital coupling channel 902 shows no USMR (e.g., the resistance across the channel may be relatively low). When magnetic particles 904 make contact with the spin-orbital coupling channel 902 (e.g., as illustrated in FIG. 9B), the magnetic/spin Hall interface is formed and USMR is present (e.g., the resistance increases to a first or a second value) indicating the magnetization directions of the magnetic particles 904.

Figure 9C:
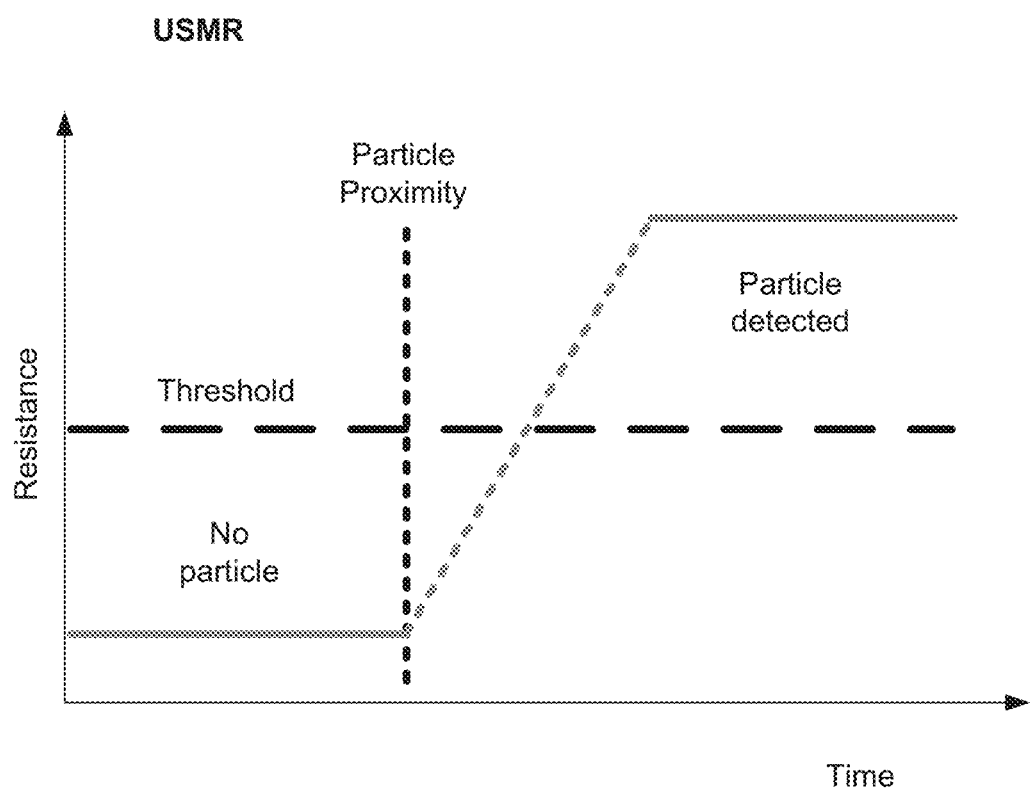

FIG. 9C is a graph illustrating example threshold for sensing presence of magnetic nano-particles. For example, when there are no magnetic nanoparticles proximate to the spin-orbital coupling channel, the resistance is relatively low. Then, as nanoparticles start to get more proximate (e.g., closer) to the spin-orbital coupling channel, the resistance increases, and when it passes a threshold, a controller may determine that magnetic nanoparticles are proximate to the spin-orbital coupling channel. As the particle gets closer and closer to the spin-orbital coupling channel, the resistance increases, and then plateaus after the particle makes contact with the spin-orbital coupling channel.

In this disclosure, the large spin orbit coupling in topological insulators results in helical spin-textured Dirac surface states that are attractive for topological spintronics. These states generate an efficient spin-orbit torque on proximal magnetic moments at room temperature. However, memory or logic spin devices based upon such switching may require a non-optimal three terminal geometry, with two terminals for the 'writing' current and one for 'reading' the state of the device. An alternative two-terminal device geometry is now possible by exploiting the recent discovery of a unidirectional spin Hall magnetoresistance in heavy metal/ferromagnet bilayers and (e.g., at low temperature) in magnetically doped topological insulator heterostructures.

This disclosure describes observation of unidirectional spin Hall magnetoresistance in a technologically relevant device geometry that combines a topological insulator with a ferromagnetic metal (including conventional ferromagnetic metal). The example devices show a figure-of-merit (magnetoresistance per current density per total resistance) that is comparable to the highest reported values in all-metal Ta/Co bilayers.

The spin Hall effect (SHE) in non-magnetic (NM) heavy metals originates in their strong spin-orbit coupling (SOC). When a charge current flows through a NM heavy metal, the SHE yields a spin accumulation at the interface with a proximal material. If the latter is a ferromagnetic (FM) layer, the spin accumulation at the interface can exchange angular momentum with the magnetic moments and exert a spin-orbit torque (SOT). In certain configurations and at sufficiently high charge current density, the magnetization in the FM can be switched. SOT switching is believed to be potentially faster and more efficient than spin transfer torque (STT) switching that is typically used in magnetic tunneling junction (MTJ) devices for memory and logic applications.

SOT switching devices consist of a current carrying channel with a proximal nanomagnet whose magnetization determines the memory or logic state. Conventional SOT switching devices need two terminals for 'writing' the state of the device and an additional terminal, usually an MTJ on top of the nanomagnet, for 'reading' the magnetization state of the device. Since the stable states of the nanomagnet are 180-degree-opposite to each other, symmetry prevents the sensing of the magnetization state using a conventional two terminal magnetoresistance, such as anisotropic magnetoresistance (AMR) or spin Hall magnetoresistance (SMR). The required presence of a third terminal for reading makes such SOT switching devices more difficult to fabricate and usually less appealing for memory and logic applications.

With the recent discovery of unidirectional spin Hall magnetoresistance (USMR) in NM/FM bilayers, such as Pt/Co and Ta/Co, the third terminal of SOT switching devices is no longer necessary. USMR originates from the interactions between the spins generated at the NM-FM interface by SOC of the NM and the conduction channels in the FM. The unique feature of USMR is its symmetry; it is sensitive to two opposite magnetization states. Therefore, this disclosure describes a two terminal SOT switching device that relies on USMR: the nanomagnet is switched by a current through the NM channel, while the state of the magnetization of the nanomagnet is simply read out using the USMR.

While much of the mainstream activity in SOT devices has focused on heavy metals, such as Ta, Pt and W, recent research has begun to explore the potential of 3D topological insulators (TIs). These are narrow band gap semiconductors wherein strong SOC and time-reversal symmetry yield helical spin-textured Dirac surface states whose spin and momentum are orthogonal. This 'spin-momentum locking' (SML) has been confirmed using direct measurements such as photoemission, electrical transport, and spin torque ferromagnetic resonance, as well as indirect means such as spin pumping. It has also been demonstrated that the spins can exert torques on a FM as one would expect of SOT in the NM/FM case.

In comparison to the NM/FM bilayers, where SOT switching and sensing using USMR have both been confirmed, the observation of USMR in TI/FM systems is just beginning to emerge. A large USMR was observed in $Cr_x(Bi_{1-y}Sb_y)_{2-x}Te_3/(Bi_{1-y}Sb_y)_2Te_3$ bilayer structures at very low temperatures. Here, the Cr-doped layer is a FM TI with a low Curie temperature and the other layer is a NM TI. For more pragmatic applications, it is desirable to explore the USMR phenomenon is heterostructures that interface a TI with a conventional FM of technological relevance. Here, the experimental observation of USMR in TI/FM heterostructures, include $(Bi,Sb)_2Te_3/CoFeB$ and $Bi_2Se_3/CoFeB$ bilayers. As illustrated in FIGS. 3A and 3B, spins are generated due to the SML of the TI when a charge current, j, is applied in the bilayer. Depending on the relative directions between the spins and magnetization of FM, spins at the interface present different conductance when interacting with the conduction channels in the FM. The USMR in TI/FM systems is similar to that in NM/FM systems with the different mechanisms of spin generation.

In experiments described in this disclosure, USMR was observed at temperatures between approximately 20 K and approximately 150 K for $(Bi,Sb)_2Te_3$ (BST) and $Bi_2Se_3$ (BS). The largest USMR among the experiment samples is about 2.7 times as large as the best USMR in Ta/Co sample, in terms of USMR per total resistance per current density, observed in 6 QL BS and CoFeB of 5 nm bilayer.

The devices studied are fabricated from BST (t QL)/ CoFeB (5)/MgO (2) and BS (t QL)/CoFeB (5)/MgO (2) thin film stacks (t=6 and 10), grown by molecular beam epitaxy (MBE) and magnetron sputtering. Hall bars of nominal length 50 µm and width 20 µm are tested with harmonic measurements under both longitudinal and transverse resistance setup. The magnetization of CoFeB is spontaneously in-plane with little perpendicular anisotropy field.

Figure 10C:
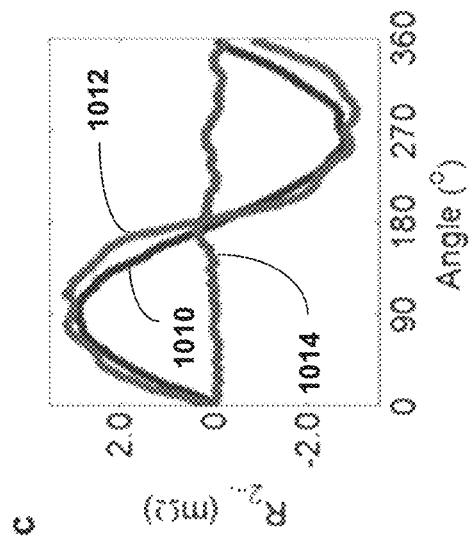
FIGS. 10B and 10C are graphs illustrating resistance as a function of angle.
Figure 10B:
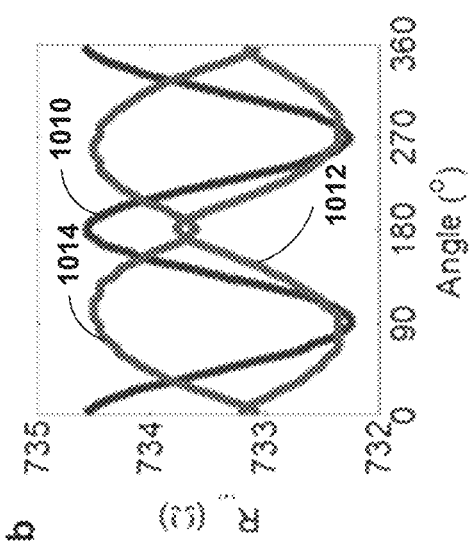
Figure 10A:
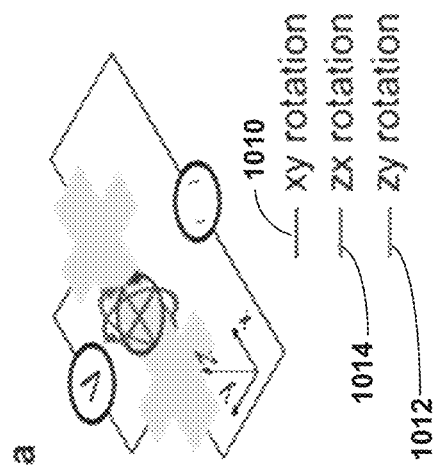
FIG. 10A is a conceptual diagram illustrating resistance measurement setup and definitions of rotation planes.

FIG. 10A is a conceptual diagram illustrating resistance measurement setup and definitions of rotation planes. FIG. 10A shows the definition of the coordinates and rotation planes. Zero angles are at x+, z+ and z+ directions for xy 10, zx 14 and zy 12 rotations respectively. The directions for rotation for increasing angle are indicated by arrows. A 3 Tesla external field is applied and rotated in the xy, zx and zy device planes while the first order resistance $R_\omega$ and second order resistance $R_{2\omega}$ are recorded with 2 mA R.M.S. AC current.

FIGS. 10B and 10C are graphs illustrating resistance as a function of angle. For example, FIGS. 10B and 10C show the angle dependencies of $R_\omega$ and $R_{2\omega}$, respectively, of the BST (10 QL)/CoFeB (5 nm)/MgO (2 nm) sample at 150 K. The $R_\omega$ exhibits typical SMR-like behavior with the $R^x > R^z > R^y$. Similar to the behavior seen in all metallic NM/FM bilayers, the variation of the second order resistance $R_{2\omega}$ with angle is also proportional to the magnetization projected along the y-direction. The period of xy and zy rotations are 360 degrees while a flat line is observed in the zx rotation. The amplitude of $R_{2\omega}$ is about 3 mΩ with an average current density of 0.667 $MA/cm^2$.

Due to Joule heating of the device and the temperature gradient across the device plane, the anomalous Nernst effect (ANE) and spin Seebeck effect (SSE) also contribute to the second order resistance. To carefully separate this contribution (denoted as $R_{2\omega}^{\Delta T}$) from the USMR, a series of measurements were carried out of Hall or transverse second order resistance with xy-plane rotations under various external field strengths.

Figures 11A, 11B, 11C:
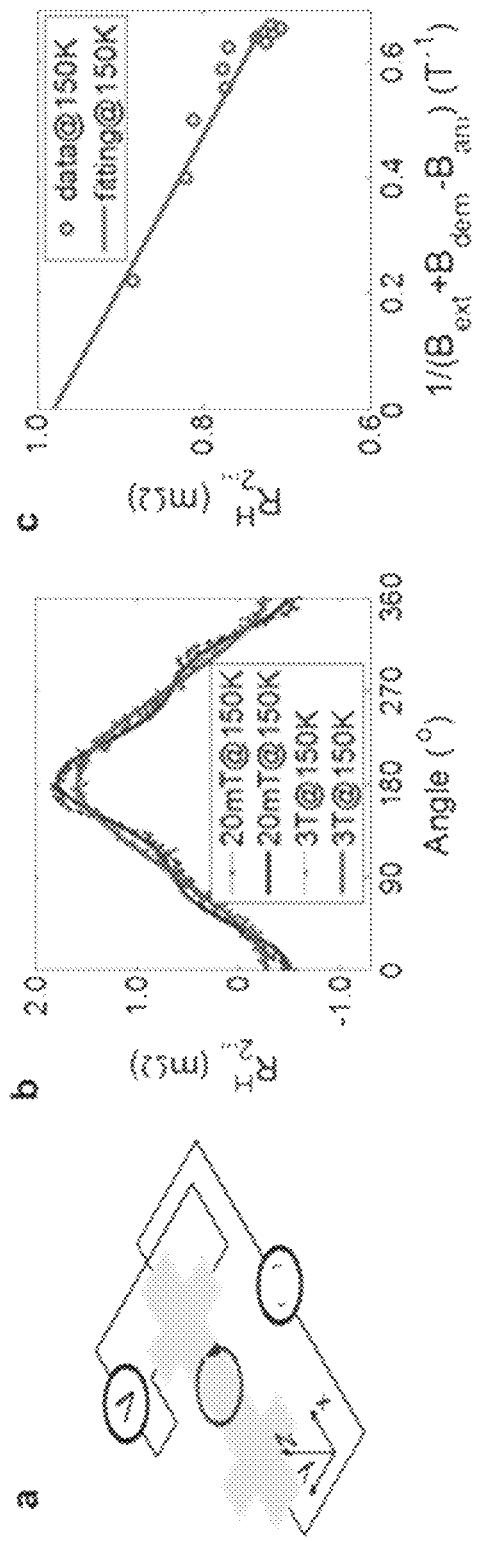
FIG. 11A is a conceptual diagram illustrating transverse/Hall resistance measurement setup.
FIGS. 11B and 11C are graphs illustrating resistance as a function of angle and external fields, respectively.

FIG. 11A is a conceptual diagram illustrating transverse/ Hall resistance measurement setup. The transverse resistance is measured while the external field is rotated in the xy-plane. The second order Hall resistance, $R_{2\omega}^H$, contains contributions from ANE/SSE, field-like (FL) SOT and anti-damping (AD) SOT. The ANE/SSE and AD SOT are proportional to cos φ while the FL SOT is proportional to cos 3φ+cos φ (ref[29]).

FIGS. 11B and 11C are graphs illustrating resistance as a function of angle and external fields, respectively. FIG. 11B shows two examples of $R_{2\omega}^{\Delta T}$ vs. angle with 20 mT and 3 T external fields, respectively. Since AD SOT and FL SOT perturb the magnetization and thus contribute to $R_{2\omega}^H$, their effects diminish at larger external field. FIG. 11B shows that the data measured in a 20 mT field contain both cos φ and cos 3φ components, while in a 3 T field, the data exhibit almost no cos 3φ component. There are two steps to obtain the $R_{2\omega}^{\Delta T}$. First, by fitting the angle dependent dat, the amplitudes of the cos φ and cos 3φ components can be extracted. The FL SOT can then be easily determined and separated. This leaves the ANE/SSE and AD SOT. A plot of the data corresponding to these contributions versus the reciprocal of total field is shown in FIG. 11C. In FIG. 11C, $B_{dem}-B_{ani}$ is the demagnetization field minus the perpendicular anisotropic field of the FM layer, which is determined to be about 1.5 T by separate measurements. Since the effect of the AD SOT will diminish at infinite field, the intercept of the fitted line is the contribution of ANE/SSE to the $2^{nd}$ order Hall resistance. Then, the contribution of ANE/SSE to the longitudinal resistance $R_{2\omega}$ can be obtained by scaling that from the Hall resistance with the relative ratio of device length to device width. Finally, the USMR is determined once the ANE/SSE contribution is subtracted from the $R_{2\omega}$.

Figure 12A:
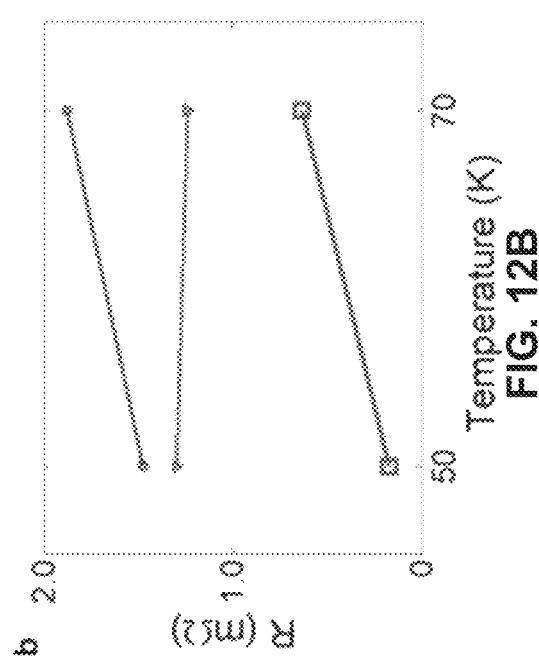
FIGS. 12A and 12B are graphs illustrating contribution for total resistance for different examples of structures that exhibit USMR effects.
Figure 12B:
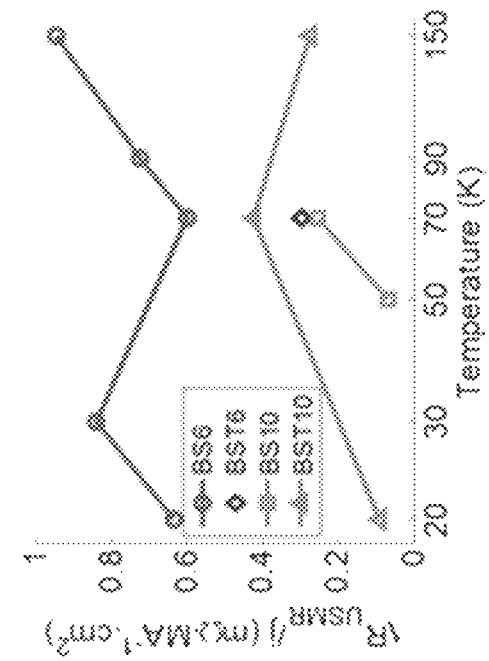

FIGS. 12A and 12B are graphs illustrating contribution for total resistance for different examples of structures that exhibit USMR effects. FIGS. 12A and 12B show the $R_{2\omega}$, $R_{2\omega}^{\Delta T}$ and $R_{USMR}$ of BST and BS samples with 2 mA and 3 mA current, respectively, at various temperatures. Temperature affects the chemical potential and the relative contributions to transport from surface and bulk conduction. As a result, even though the magnetization and resistivity of the CoFeB layer vary little within the range of temperature in the experiments, the charge to spin conversion in TIs and the related USMR are both strongly temperature dependent. The BST/CoFeB sample gives the highest USMR at 70 K while the $R_{2\omega}$ and $R_{2\omega}^{\Delta T}$ keep increasing with increasing temperature up to 150 K. The USMR of BS/CoFeB may only be confirmed within between 50 K and 70 K because of larger noise and magnetic field dependent signal outside the temperature window. At 70 K, BST and BS samples show resistance $R^z$ of 733 Ψ and 489 Ψ, and USMR per current density of 1.067 $mΨ/MA/cm^2$ and 0.633 $mΨ/MA/cm^2$, respectively. The ratios of USMR per current density to total resistance of the two samples are 1.45 $ppm/(MA/cm^2)$ and 1.30 $ppm/(MA/cm^2)$, respectively. These values are slightly better than the best result obtained using Ta/Co bilayers (1.14 $ppm/(MA/cm^2)$ at room temperature)[9].

Figure 13A:
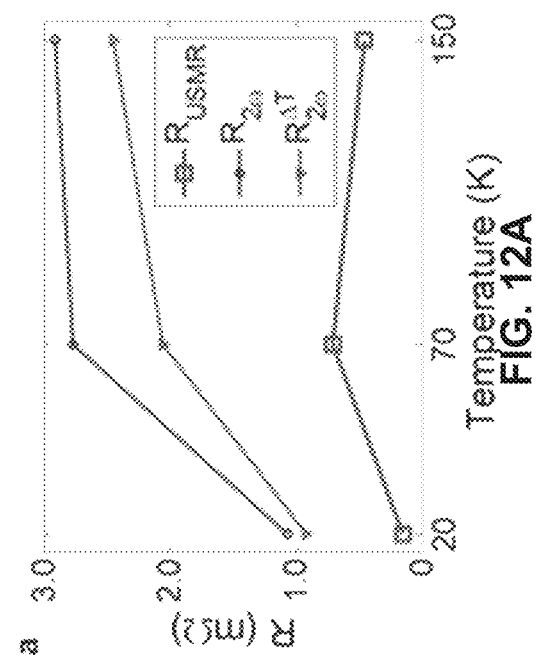
FIGS. 13A and 13B are graphs illustrating USMR per current density per total resistance and sheet USMR per current density, respectively, as a function of temperature.
Figure 13B:
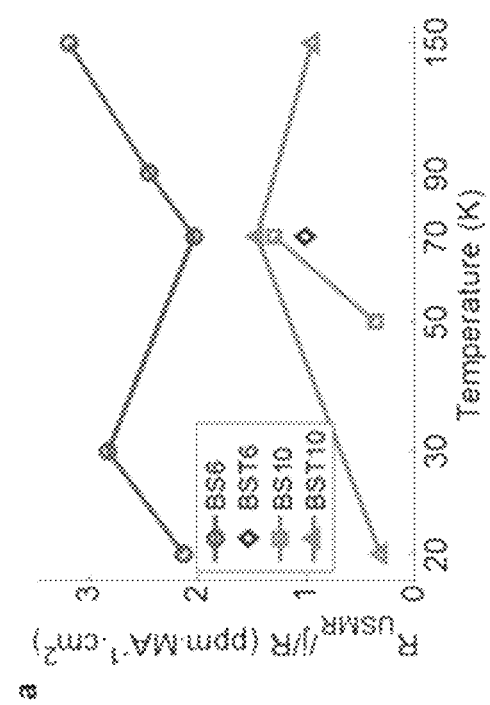

FIGS. 13A and 13B are graphs illustrating USMR per current density per total resistance and sheet USMR per current density, respectively, as a function of temperature. For example, FIGS. 13A and 13B show USMR per current density per total resistance ($R_{USMR}/j/R$) and sheet USMR per current density ($\Delta R_{USMR}/j$) of all four samples as a function of temperature. This provides a more meaningful figure-of-merit for comparisons of USMR across different types of samples. These two values also show very similar trends for all samples at various temperatures, except for the comparison between BST6 and BS10 at 70K, in which BST6 is lower than BS10 in terms of $R_{USMR}/j/R$ but higher in terms of $\Delta R_{USMR}/j$. The swap of position is mostly due to the larger total resistance of BS10 compared to BST6 while they show similar $R_{USMR}/j$. The largest $R_{USMR}/j/R$ and $\Delta R_{USMR}/j$ are 3.19 $ppm/MA·cm^2$ and 0.95 $mΨ/MA·cm^2$, respectively, and both observed in BS6 at 150 K. It is more than as twice large as the best reported Ta/Co case. As mentioned before, the USMR measurements beyond the temperature ranges of the plots of each sample show strong noise and field-dependent signal background as to render the estimations of USMR unreliable.

The above demonstrates the presence of USMR in topological insulator/ferromagnetic layer heterostructures. The USMR was observable with a much lower current density compared to all metallic NM/FM bilayers. The ratios of USMR per current density to total resistance are found to be comparable to the best result reported so far in Ta/Co bilayers. The observation of USMR in a TI/FM system is usable to build a two terminal TI-based SOT switching device. Such a two-terminal topological spintronic switching device is potentially more efficient compared to MTJs that use STT switching due to the large SOC of TIs. The observed USMR may enable the read operation of such a device without having to build a MTJ structure on top of TI. Such two terminal devices may be more architecture friendly and easier embed in current STT magnetic random access memory architectures.

The following describes method for forming the bilayer structures to achieve the USMR effects. The $Bi_2Se_3$ or $(Bi_{1-x}Sb_x)_2Te_3$ films were grown by MBE on InP (111)A substrates. The InP (111)A substrate is initially desorbed at 450° C. in an EPI (Veeco) 930 MBE under high purity (7N) $As_4$ supplied by a Knudsen cell until a 2×2 reconstruction is visible in reflection high energy electron diffraction. The substrate is then moved under vacuum to an EPI 620 MBE for the Bi-chalcogenide deposition. $Bi_2Se_3$ films were grown from high purity (5N) Bi and Se evaporated from Knudsen cells at a beam equivalent pressure flux ratio of 1:14. The substrate temperature was 325° C. (pyrometer reading of 250° C.) and the growth rate was 0.17 nm/min. The films have a root mean squared (RMS) roughness of approximately 0.7 nm over a 25 $\mu m^2$ area measured by atomic force microscopy (AFM). For $(Bi,Sb)_2Te_3$ films, the flux ratio of Bi to Sb was 1:3 and (Bi+Sb):Te is at a flux ratio of approximately 1:12 for a growth rate of 0.44 nm/min with a RMS roughness of approximately 1.1 nm over a 25 $\mu m^2$ area measured by AFM. These films are grown at a substrate temperature of 315° C. (240° C. measured by a pyrometer) using 5N purity Sb and 6N Te from Knudsen cells. Film thickness is measured by X-ray reflectivity and crystal quality by high-resolution X-ray diffraction rocking curves of the (006) crystal plane—with a full width half max (FWHM) of approximately 0.28 and 0.11 degrees for $Bi_2Se_3$ and $(Bi,Sb)_2Te_3$ films respectively.

The MBE-grown TIs were then sealed in Argon gas and transported to an ultra-high vacuum (UHV) six-target Shamrock sputtering system which could achieve a based pressure better than $5 \times 10^{-8}$ Torr at room temperature. The thin films were first gently etched by Argon ion milling. Then the CoFeB layer was deposited using a $Co_{20}Fe_{60}B_{20}$ target. An MgO layer was deposited to serve as a protection layer. The device fabrication began with a photolithography followed by an ion milling etching to define the Hall bars. Then the second photolithography and an e-beam evaporation followed by a liftoff were performed to make contacts.

The devices were tested in a Quantum Design PPMS which provides temperature control, external field and rotation. The AC current at 10 Hz was supplied by a Keithley 6221 current source. A Stanford Research SR830 or an EG&G 7265 lock-in amplifier paired with an EG&G 7260 lock-in amplifier were used to measure the first and second harmonic voltages, respectively and simultaneously.

Figure 14:
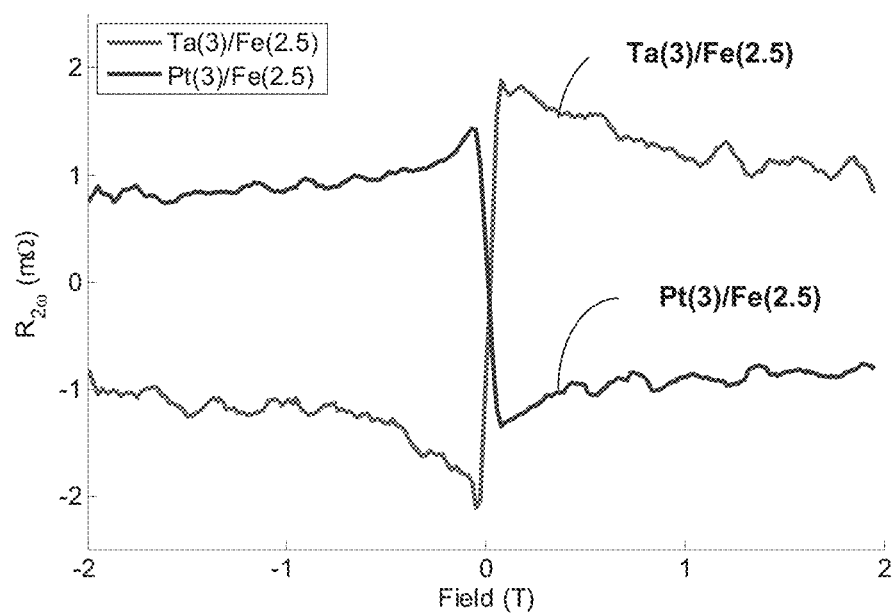
FIG. 14 is a graph illustrating resistance as a function of magnetic field for different structures.

FIG. 14 is a graph illustrating resistance as a function of magnetic field for different structures. For instance, FIG. 14 illustrates USMR in heavy metal/FM systems such as Ta/Fe and Pt/Fe.

Figure 15A:
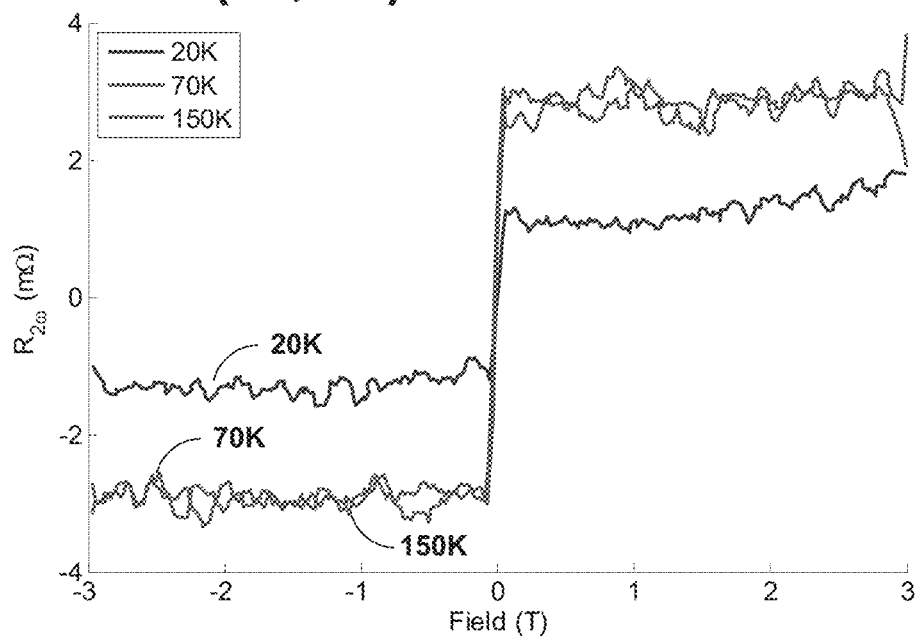
FIGS. 15A-15C are graphs illustrating resistance as a function of magnetic field for additional structures are different temperatures.
Figure 15B:
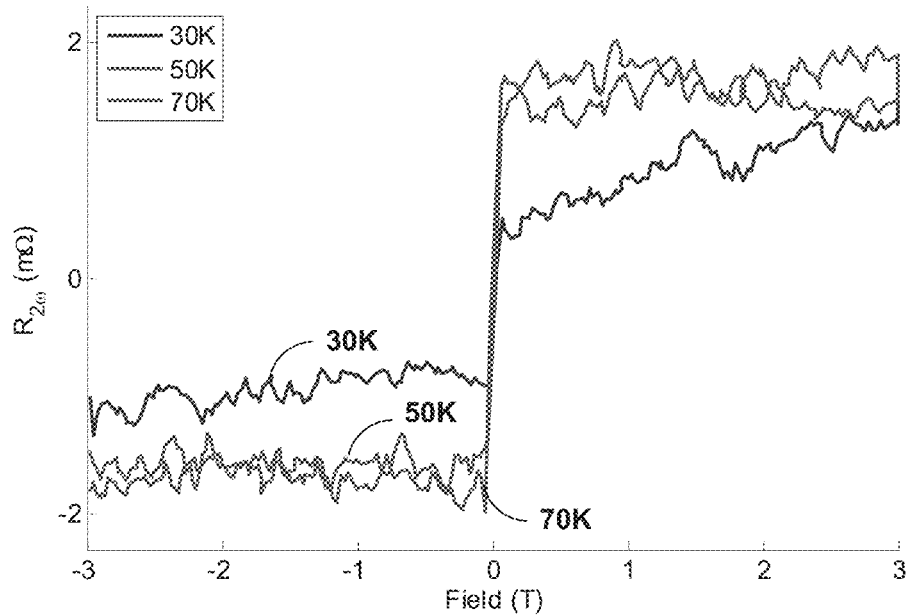
Figure 15C:
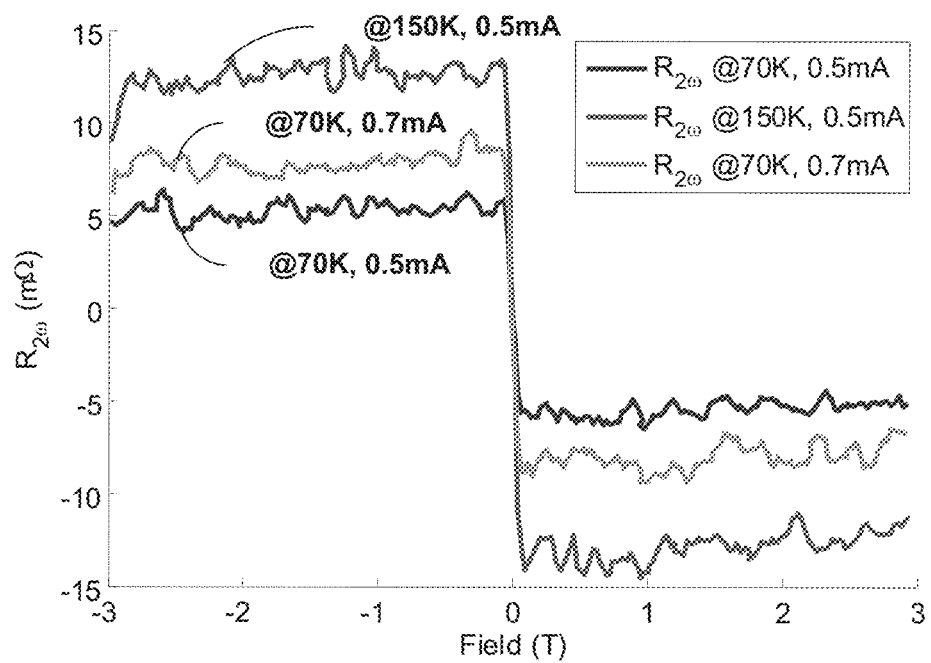

FIGS. 15A-15C are graphs illustrating resistance as a function of magnetic field for additional structures are different temperatures. FIGS. 15A-15C illustrates the use of topological insulators as spin-orbital coupling channel. The surface states of a topological insulator (TI) exhibit spin-moment locking. If a charge current is applied across a TI channel, the electrons on top/bottom surface are also spin-polarized to right/left. Although the physical process may be different from spin Hall effect, the phenomena may be essentially equivalent (e.g., a change current in the channel induces spins on top/bottom surface pointing right/left). Torques exerted on a FM by Tis with planar Hall effect measurements have been observed.

FIGS. 15A-15C illustrate the USMR in TI/FM systems for different types of bilayer structures. For example, FIG. 15A illustrates with bilayer structure of $(Bi,Sb)_2Te_3$/CoFeB, and FIG. 15B illustrates with bilayer structure of $Bi_2Se_3$/CoFeB. There may be even larger USMR when the CoFeB is replaced with magnetic insultor (MI), yttrium iron garnet (YIG), as illustrated in FIG. 15C.

Figure 16:
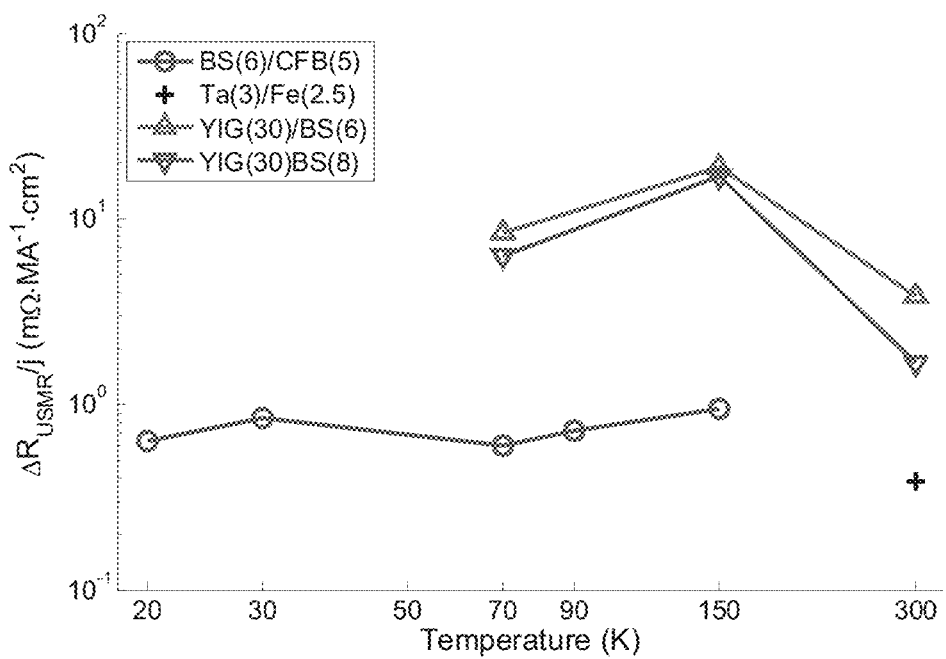
FIG. 16 is a graph illustrating sheet USMR comparison.

FIG. 16 is a graph illustrating sheet USMR comparison. As illustrated in FIG. 16, the USMR of YIG/BS, in terms of sheet resistance per current density, is an order of magnitude larger than the best USMR observed among TI/CFB systems. The USMR may be as large as 50× of that in the Ta(3)/Fe(2.5). Accordingly, USMR may provide potential of being further improved towards practical applications. In some examples, the TIs serve the same role as other heavy metals or spin Hall materials. These material, including Tis, are referred to, generally, as spin Hall material/channel and their functions of generating spins as spin Hall effect in general.

Figure 17:
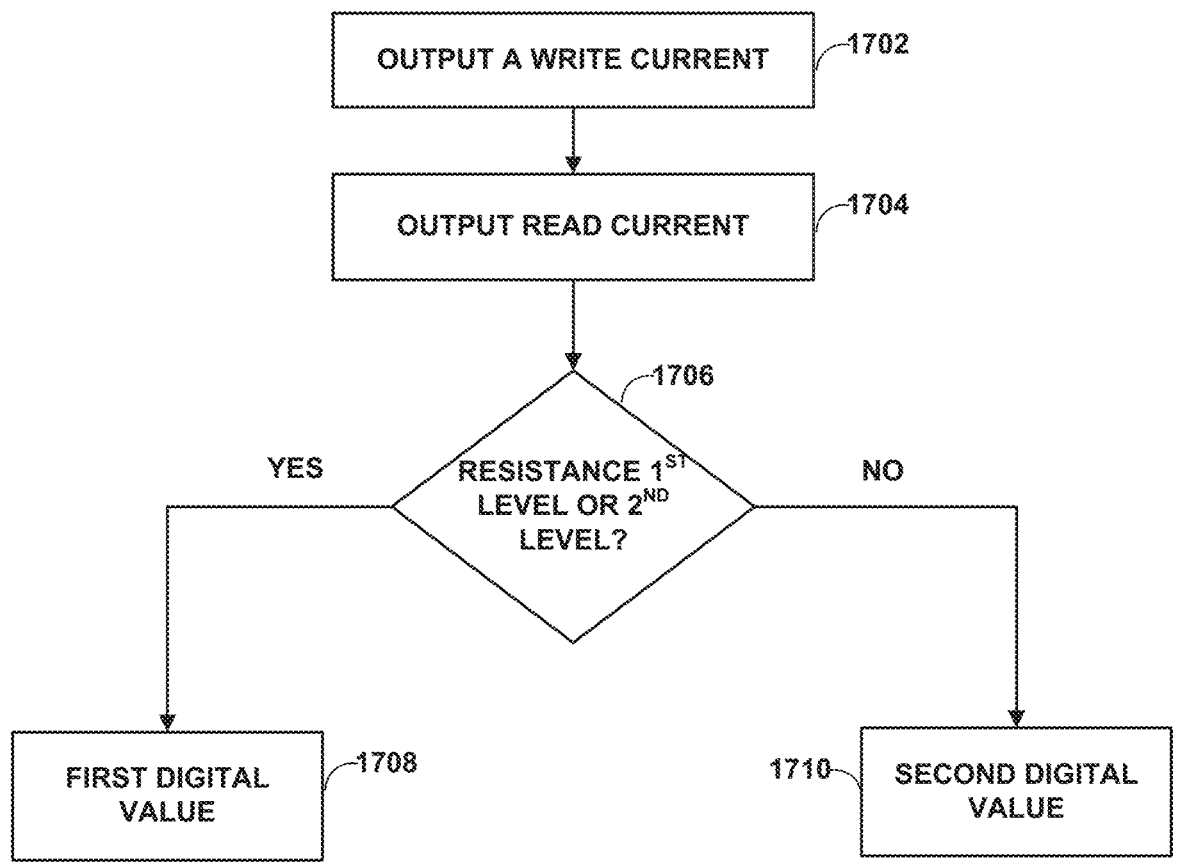
FIG. 17 is a flowchart illustrating example operations of a device configured to write to and read from a two-terminal spintronic device.

FIG. 17 is a flowchart illustrating example operations of a device configured to write to and read from a two-terminal spintronic device. For purposes of illustration only, the method of FIG. 17 will be explained with reference to the example system 400 described in FIG. 4; however, the method may apply to other examples.

Controller circuit 420 outputs a write current through a spin-orbital coupling channel 402 (1702). For example, controller circuit 420 may output a pulse that has current density that satisfies (e.g., is greater than) a first threshold current density through contact 422A. The pulse may generate a spin current by causing the spin of electrons 414 at the interface of contact 422A and spin-orbital coupling channel 402 to align in a particular direction. The spin current at the interface of contact 422A and spin-orbital coupling channel 402 may cause the resistance structure 410 to change from a first resistance level (e.g., indicative of a digital high) to a second resistance level (e.g., indicative of a digital low). For example, the spin current may set the magnetization direction of magnet 404 from a first magnetization direction (e.g., parallel) to a second magnetization direction (e.g., anti-parallel), which may change the resistance of interface 403, and thus changing the resistance of structure 410.

Controller circuit 420 outputs a read current through the spin-orbital coupling channel 402 (1704). For example, controller circuit 420 may output a pulse that has a current density that does not satisfy (e.g., is less than) a second threshold current density. The second threshold current density may be the same or different than the first threshold current density. Controller circuit 420 determines whether the resistance of structure 410 is at a first resistance value or a second resistance value (1706). For example, controller circuit 420 may determine a voltage across structure 410 while outputting the read current. The voltage across structure 410 may be indicative of the resistance of structure 410 (and hence the resistance of interface 403 between spin-orbital coupling channel 402 and magnet 404). For example, when controller circuit 420 determines that the voltage across structure 410 is a first voltage, controller circuit 420 may determine that the resistance of structure 410 is a first resistance value. Similarly, when controller circuit 420 determines that the voltage across structure 410 is a second voltage, controller circuit 420 may determine that the resistance of structure 410 a second resistance value.

Responsive to determining that the resistance of structure 410 is at the first resistance value ("First" branch of 1706), controller circuit 420 determines that the memory cell corresponds to a first digital value (1708). The first resistance value corresponds to a first digital value (e.g., one of a digital high or a digital low). Thus, in some examples, when controller circuit 420 determines that the resistance value of structure 410 corresponds to a first voltage, controller circuit 420 may determine that memory cell 401 represents a first digital value (e.g., one of a "0" or "1").

Responsive to determining that the resistance of structure 410 is at the second resistance value ("Second" branch of 1706), controller circuit 420 determines that the memory cell corresponds to a second digital value (1710). The second resistance value corresponds to a second digital value (e.g., the other of the digital high or the digital low). Thus, in some examples, when controller circuit 420 determines that the resistance value of structure 410 corresponds to a second voltage, controller circuit 420 may determine that memory cell 401 represents a second digital value (e.g., the other of the "0" or "1").

Various embodiments of the invention have been described. These and other embodiments are within the scope of the following claims.

What is claimed is:

1. A method of manufacturing a memory device comprising:
    forming a first contact line;
    forming a second contact line;
    forming a spin-orbital coupling channel such that the spin-orbital coupling channel is coupled to, and is positioned between, the first contact line and second contact line, and such that the spin-orbital coupling channel is directly coupled to at least one of the first contact line or the second contact line; and
    forming a magnet such that the magnet is positioned between the first contact line and the second contact line and such that the magnet is directly coupled to the spin-orbital coupling channel and the at least one of the first contact line or the second contact line,
    wherein forming the spin-orbital coupling channel comprises forming the spin-orbital coupling channel such that a resistance of the magnet and the spin-orbital coupling channel is a unidirectional magnetoresistance and such that the unidirectional resistance is not based on a magnetization direction of the magnet relative to a magnetization direction of another magnet.

2. The method of claim 1, wherein the unidirectional magnetoresistance of the magnet and the spin-orbital coupling channel comprises a first resistance when the magnetization direction of the magnet is a first direction and a second resistance when the magnetization direction of the magnet is a second direction.

3. The method of claim 2, wherein the first direction is approximately 0 degrees and the second direction is approximately 180 degrees.

4. The method of claim 1, wherein forming the magnet comprises arranging the magnet vertically relative to the spin-orbital coupling channel.

5. The method of claim 1, wherein a first interface between the spin-orbital coupling channel and the magnet defines a first plane, wherein the first plane is substantially perpendicular to a second plane defined by a second interface between the magnet and the first contact line or a third plane defined by a third interface between the spin-orbital coupling channel and the first contact line.

6. The method of claim 1,
    wherein forming the magnet comprises forming the magnet such that the magnet is directly coupled to the first contact line and the second contact line, and
    wherein forming the spin-orbital coupling channel comprises forming the spin-orbital coupling channel such that the spin-orbital coupling channel is directly coupled to the first contact line and the second contact line.

7. The method of claim 1, further comprising forming a selector that is directly coupled to the magnet, the spin-orbital channel, and at least one of the first contact line or the second contact line.

8. The method of claim 1, further comprising:
    forming a via coupled to the first contact line; and
    forming a selector line coupled to the spin-orbital coupling channel and the via.

9. The method of claim 1, wherein forming the spin-orbital coupling channel comprises forming the spin-orbital channel from one or more of:
    a heavy metal, or
    a topological insulator.

10. The method of claim 1, wherein the spin-orbital coupling channel comprises a first spin-orbital coupling channel, the magnet comprises a first magnet, the method further comprising:
    forming a third contact line;
    forming a second spin-orbital coupling channel such that the second spin-orbital coupling channel is coupled to, and is positioned between, the second contact line and the third contact line; and
    forming a second a magnet such that the second magnet is coupled to the second spin-orbital coupling channel and is positioned between the second contact line and the third contact line,
    wherein forming the second spin-orbital coupling channel comprises forming the second spin-orbital coupling channel such that a resistance of the second magnet and the second spin-orbital coupling channel is a unidirectional magnetoresistance.

11. The method of claim 1, wherein the spin-orbital coupling channel comprises a first spin-orbital coupling channel and the magnet comprises a first magnet, the method further comprising:
    forming a plurality of spin-orbital coupling channels and a corresponding plurality of magnets sandwiched between the first contact line and the second contact line such that a resistance of a respective spin-orbital coupling channel of the plurality of spin-orbital coupling channels and the corresponding magnet of the plurality of magnets is a unidirectional magnetoresistance.

12. A method of manufacturing a memory device, the method comprising:
    forming a first contact line;
    forming a second contact line;
    forming a third contact line;
    forming a first spin-orbital coupling channel such that the first spin-orbital coupling channel is positioned between the first contact line and second contact line and is directly coupled to at least one of the first contact line or the second contact line;
    forming a second spin-orbital coupling channel such that the second spin-orbital coupling channel is positioned between the second contact line and the third contact line and is directly coupled to at least one of the second contact line or the third contact line;
    forming a first magnet such that the first magnet is positioned between the first contact line and the second contact line and is directly coupled to the first spin-orbital coupling channel; and forming a second magnet such that the second magnet is positioned between the second contact line and the third contact line and is directly coupled to the second spin-orbital coupling channel, wherein forming the first spin-orbital coupling channel comprises forming the first spin-orbital coupling channel such that a resistance of the first magnet and the first spin-orbital coupling channel is a first unidirectional magnetoresistance, and wherein forming the second spin-orbital coupling channel comprises forming the second spin-orbital coupling channel such that a resistance of the second magnet and the second spin-orbital coupling channel is a second unidirectional magnetoresistance.

13. The method of claim 12, wherein forming the first magnet comprises forming the first magnet such that the first magnet is directly coupled to the at least one of the first contact line or the second contact line, and wherein the forming the second magnet comprises forming the second magnet such that the second magnet is directly coupled to the at least one of the second contact line or the third contact line.

14. The method of claim 12, further comprising:

forming a first selector such that the first selector is directly coupled to the first magnet, the first spin-orbital channel, and at least one of the first contact line or the second contact line, and forming a second selector such that the second selector is directly coupled to the second magnet, the second spin-orbital channel, and at least one of the second contact line or the third contact line.

15. The method of claim 12, wherein forming the first magnet and the first spin-orbital coupling channel comprises forming the first magnet and the first spin-orbital coupling channel such that the first magnet and the first spin-orbital coupling channel are arranged in a crossbar configuration with the second magnet and second spin-orbital coupling channel.

16. The method of claim 12, wherein forming the first magnet and the first spin-orbital coupling channel comprises forming the first magnet and the first spin-orbital coupling channel such that the first magnet and first spin-orbital coupling channel are arranged on top of the second magnet and second spin-orbital coupling channel to form a 3D memory architecture.

17. A method comprising:

outputting, by a controller, a write current through a spin-orbital coupling channel of a memory device that includes a first contact line coupled to a first side of the spin-orbital coupling channel, a second contact line coupled to a second side of the spin-orbital coupling channel that is opposite the first side, and a magnet coupled to the spin-orbital coupling channel and positioned between the first contact line and the second contact line, to set a resistance of the magnet of the memory device to a first resistance level indicative of a first digital value or a second resistance level indicative of a second digital value; and outputting, by the controller, a read current through the spin-orbital coupling channel to determine whether a unidirectional magnetoresistance of the magnet and the spin-orbital coupling channel is at the first resistance level or the second resistance level, without outputting a current through the magnet.

18. The method of claim 17, wherein outputting the write current comprises outputting the write current with a first current density greater than or equal to a threshold current density for setting a magnetization direction of the magnet, and wherein outputting the read current comprises outputting the read current with a second current density less than the threshold current density.

* * * * *